United States Patent
Maejima

(10) Patent No.: US 8,952,426 B2
(45) Date of Patent: Feb. 10, 2015

(54) THREE DIMENSIONAL STACKED NONVOLATILE SEMICONDUCTOR MEMORY

(75) Inventor: Hiroshi Maejima, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 678 days.

(21) Appl. No.: 12/407,403

(22) Filed: Mar. 19, 2009

(65) Prior Publication Data

US 2009/0267128 A1 Oct. 29, 2009

(30) Foreign Application Priority Data

Apr. 23, 2008 (JP) ................................. 2008-112658

(51) Int. Cl.
*H01L 29/76* (2006.01)
*H01L 27/115* (2006.01)

(52) U.S. Cl.
CPC .... *H01L 27/11578* (2013.01); *H01L 27/11565* (2013.01); *H01L 27/11573* (2013.01); *H01L 27/11582* (2013.01)
USPC ................... 257/214; 257/316; 257/E27.104; 257/E21.645

(58) Field of Classification Search
CPC .................. H01L 27/11565; H01L 27/11582; H01L 27/11578; H01L 29/788
USPC ................ 257/314–324, E27.112, E27.075, 257/E27.084, E27.098, E27.104, E21.645; 438/257, 258
See application file for complete search history.

(56) References Cited

U.S. PATENT DOCUMENTS

| | | | |
|---|---|---|---|
| 7,570,517 B2 * | 8/2009 | Kwak et al. | 365/185.17 |
| 2005/0128843 A1 * | 6/2005 | Kajimoto et al. | 365/205 |
| 2006/0268612 A1 * | 11/2006 | Takeuchi | 365/185.17 |
| 2007/0012959 A1 * | 1/2007 | Hachino et al. | 257/260 |
| 2007/0252201 A1 * | 11/2007 | Kito et al. | 257/331 |
| 2007/0285985 A1 * | 12/2007 | Kwak et al. | 365/185.17 |
| 2008/0006869 A1 * | 1/2008 | Kamigaichi et al. | 257/315 |

(Continued)

FOREIGN PATENT DOCUMENTS

| | | |
|---|---|---|
| JP | 2003-78044 | 3/2003 |
| JP | 2005-142493 | 6/2005 |

(Continued)

OTHER PUBLICATIONS

H. Tanaka, et al., "Bit Cost Scalable Technology with Punch and Plug Process for Ultra High Density Flash Memory", Symposium on VLSI Technology Digest of Technical Papers, 2007, pp. 14-15.

(Continued)

*Primary Examiner* — Cuong Q Nguyen
*Assistant Examiner* — Yosef Gebreyesus
(74) *Attorney, Agent, or Firm* — Oblon, Spivak, McClelland, Maier & Neustadt, L.L.P.

(57) ABSTRACT

A three dimensional stacked nonvolatile semiconductor memory according to an example of the present invention includes a memory cell array comprised of first and second blocks disposed side by side in a first direction, and a driver disposed on one end of the memory cell array in a second direction orthogonal to the first direction. A source diffusion layer, which is common to the first and second blocks, is disposed in a semiconductor substrate, and a contact plug, which has a lower end connected to the source diffusion layer and an upper end connected to a source line disposed above at least three conductive layers, is interposed between the first and second blocks.

23 Claims, 32 Drawing Sheets

(56) References Cited

U.S. PATENT DOCUMENTS

| | | | |
|---|---|---|---|
| 2008/0048237 A1* | 2/2008 | Iwata | 257/314 |
| 2008/0067554 A1* | 3/2008 | Jeong et al. | 257/211 |
| 2008/0272434 A1* | 11/2008 | Park et al. | 257/347 |
| 2012/0307568 A1* | 12/2012 | Banna et al. | 365/185.28 |

FOREIGN PATENT DOCUMENTS

| | | |
|---|---|---|
| JP | 2007-242736 A | 9/2007 |
| JP | 2007-266143 | 10/2007 |
| JP | 2007-266143 A | 10/2007 |
| JP | 2008-4765 | 1/2008 |

OTHER PUBLICATIONS

Office Action issued Oct. 30, 2012 in Japanese Application No. 2008-112658 (With English Translation).

Office Action issued Feb. 5, 2013, in Japanese Patent Application No. 2008-112658.

U.S. Appl. No. 14/020,174, filed Sep. 6, 2013, Kamata, et al.

U.S. Appl. No. 14/020,246, filed Sep. 6, 2013, Kamata, et al.

* cited by examiner

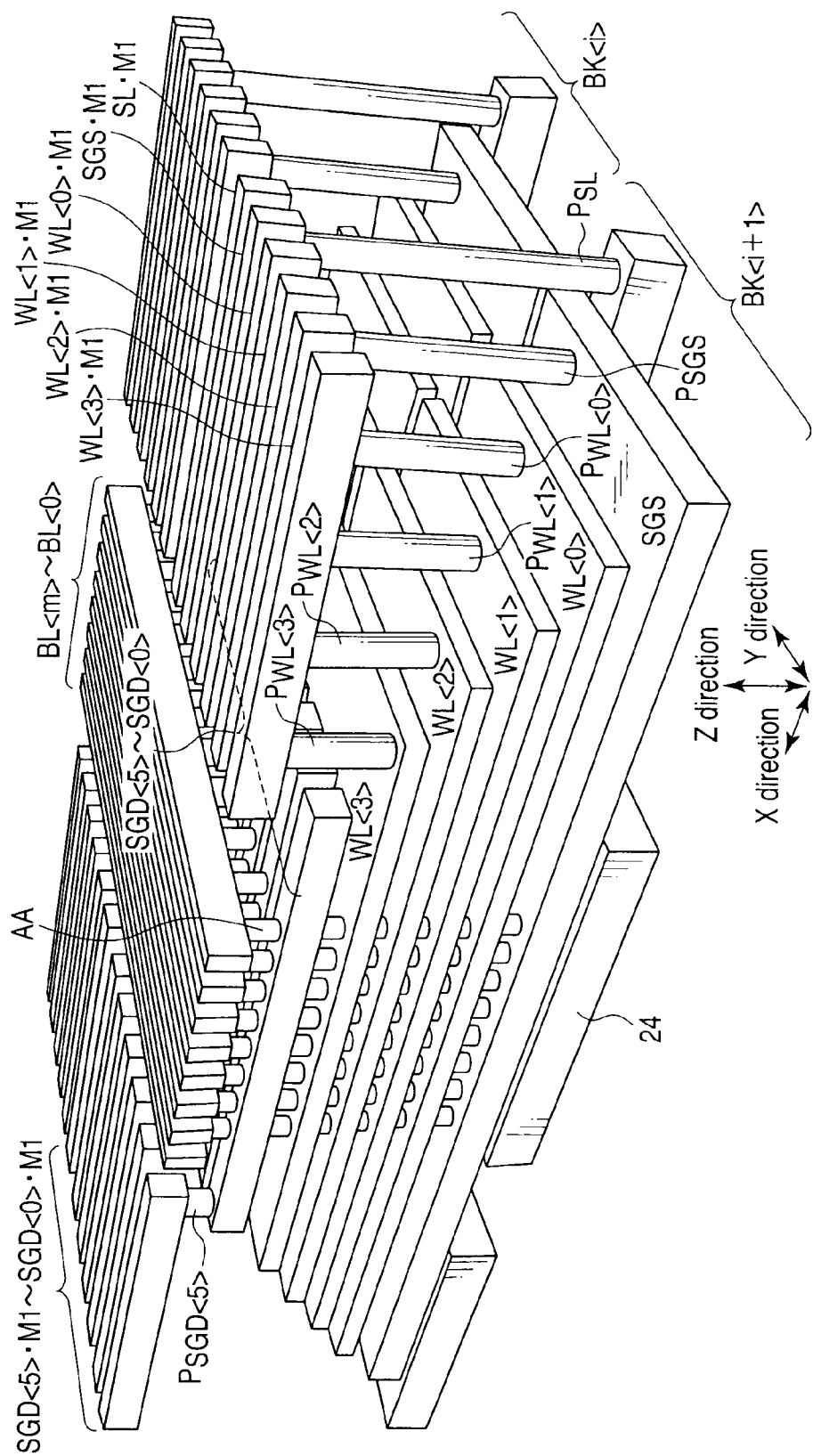
F I G. 1

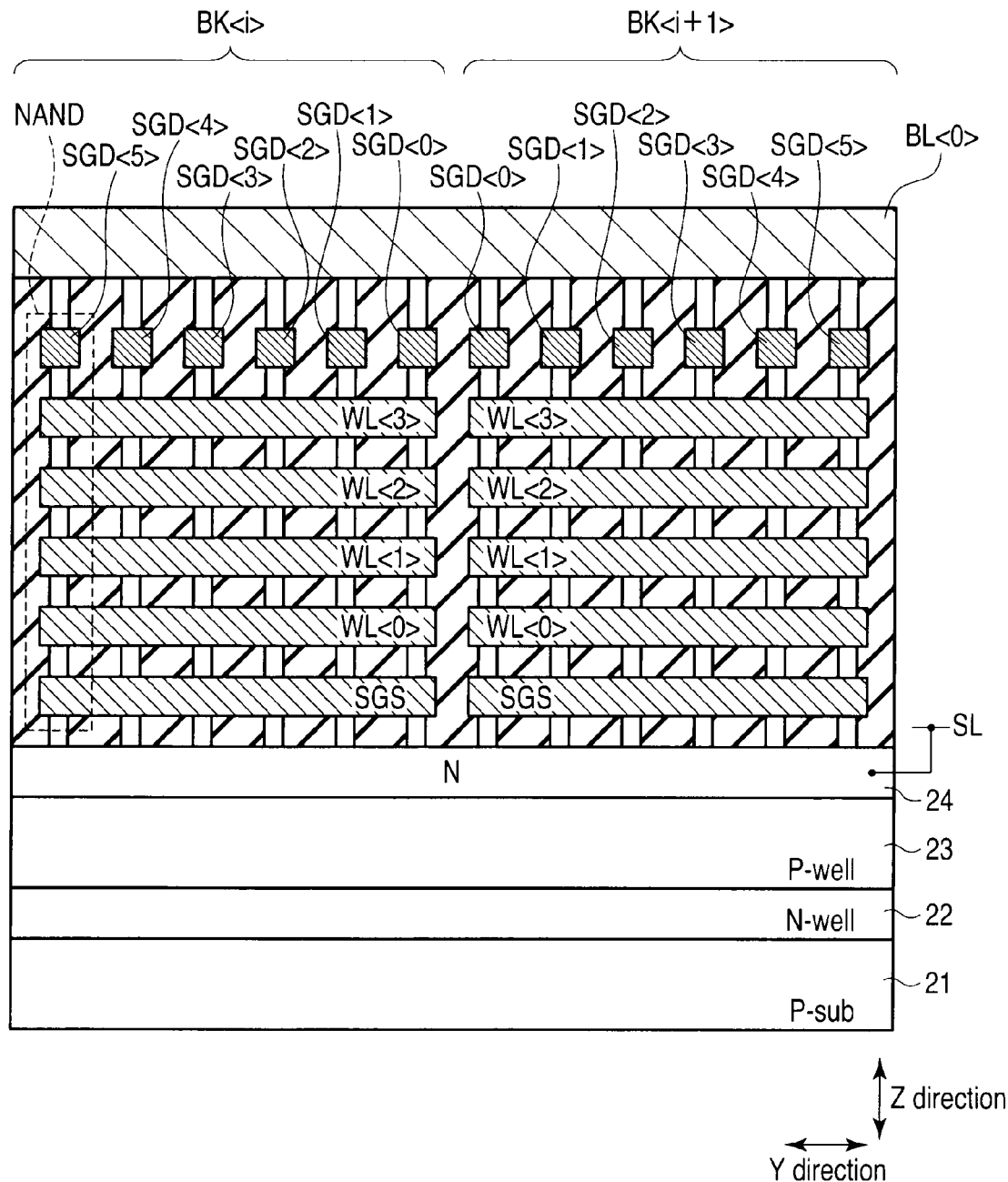
F I G. 4

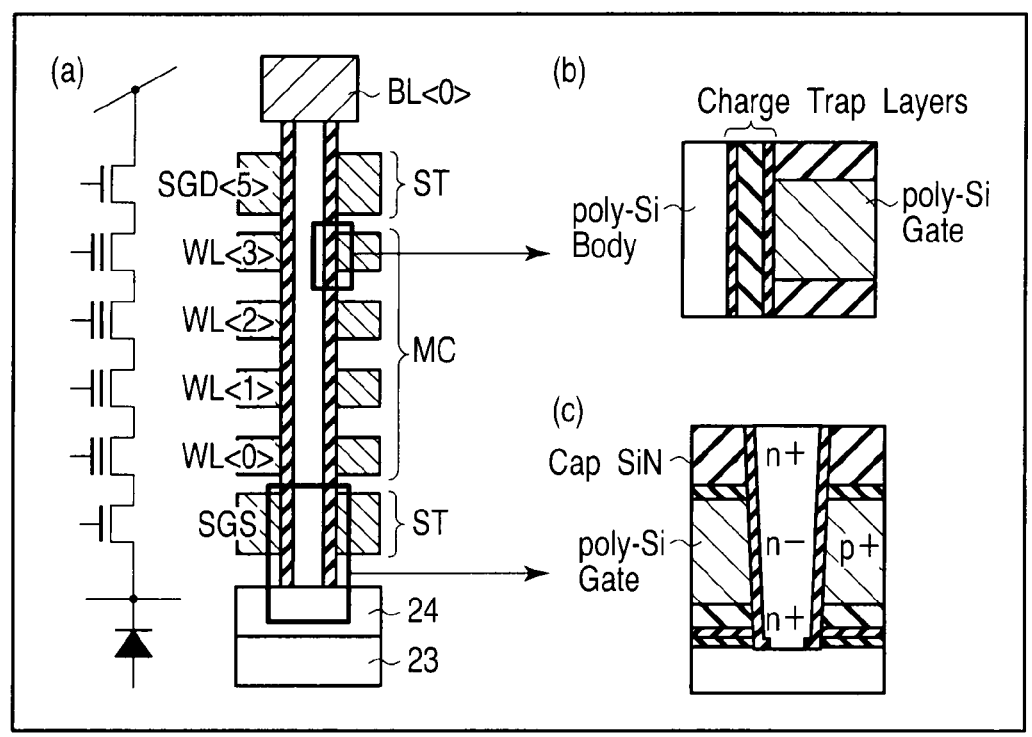
F I G. 5

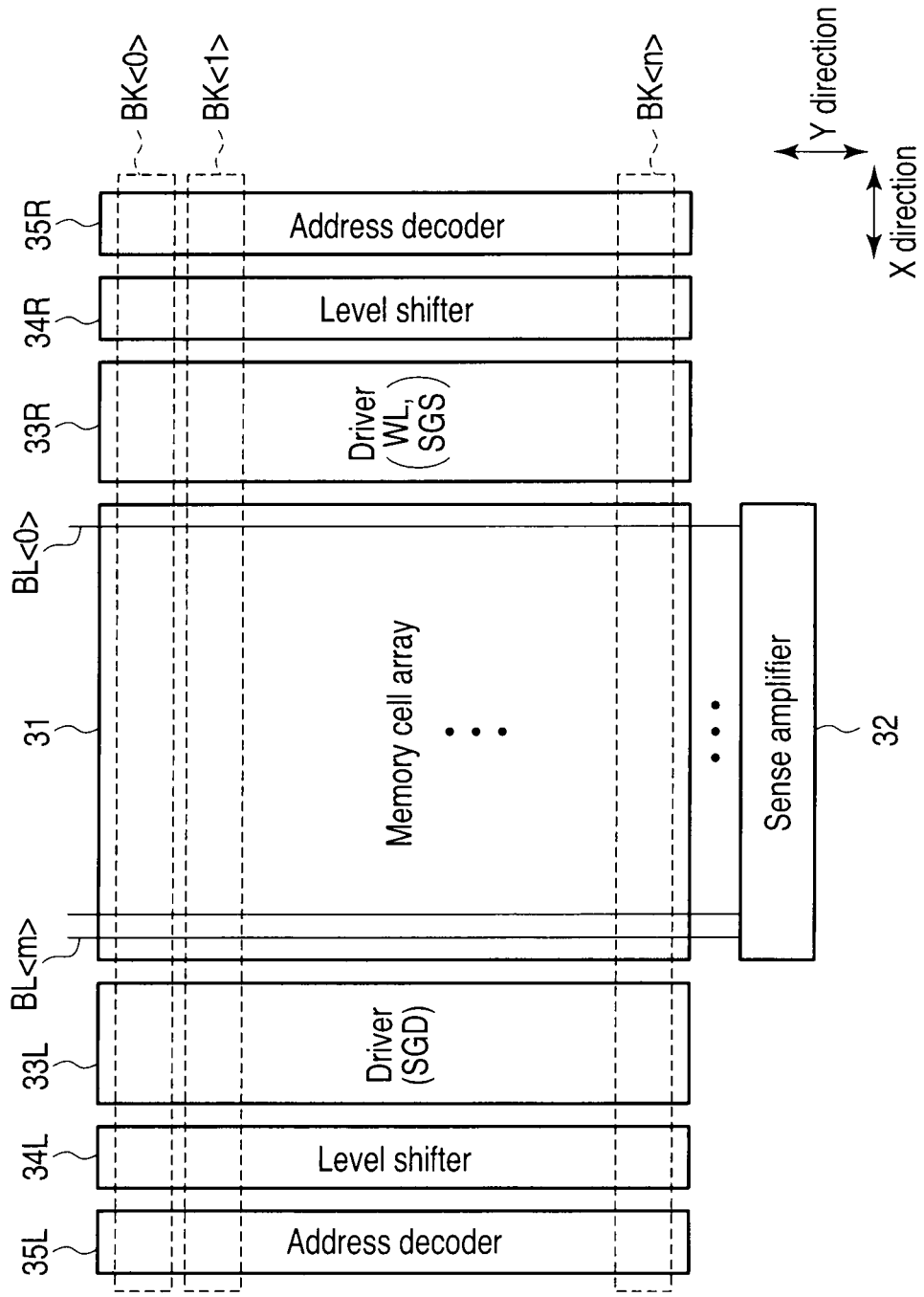
F I G. 9

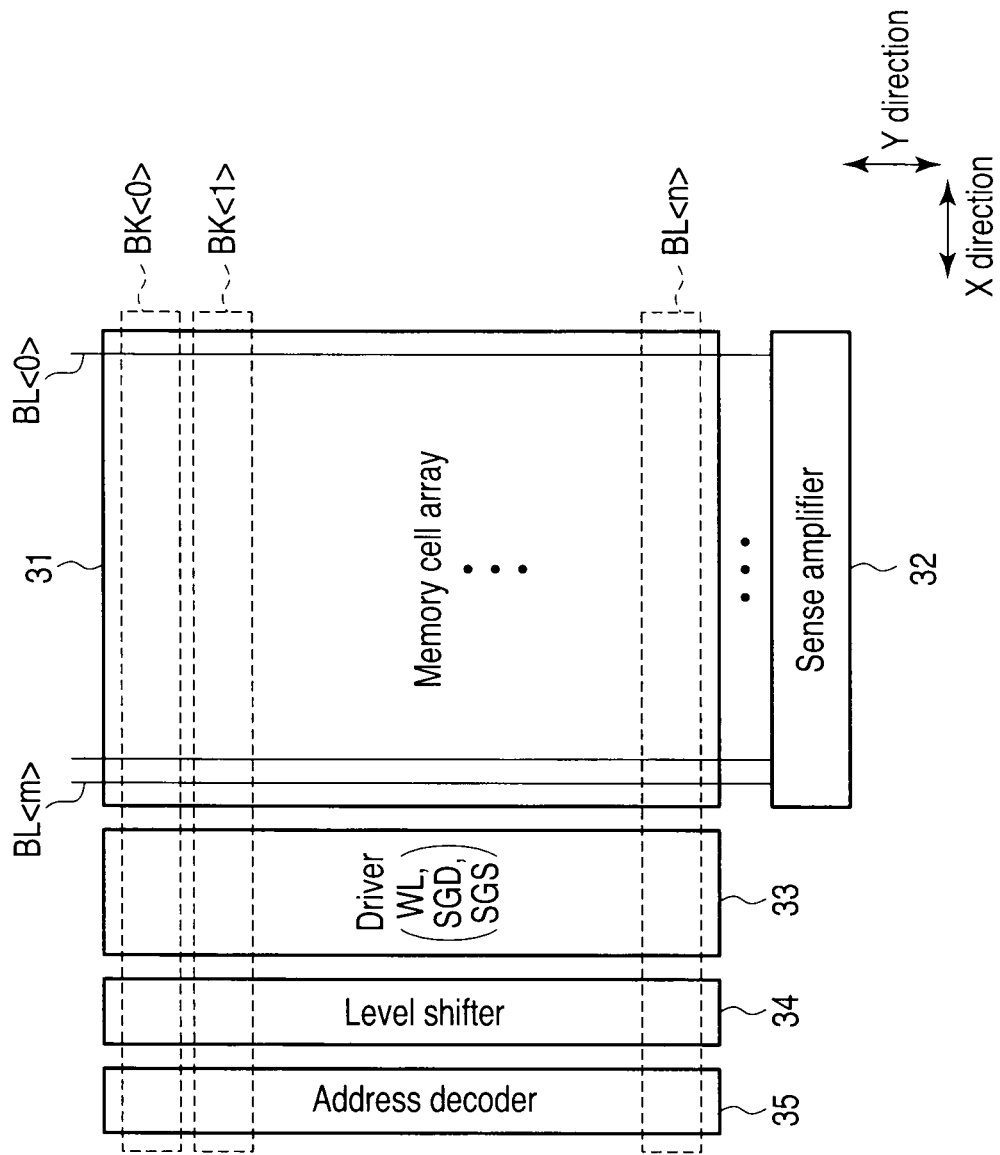
F I G. 10

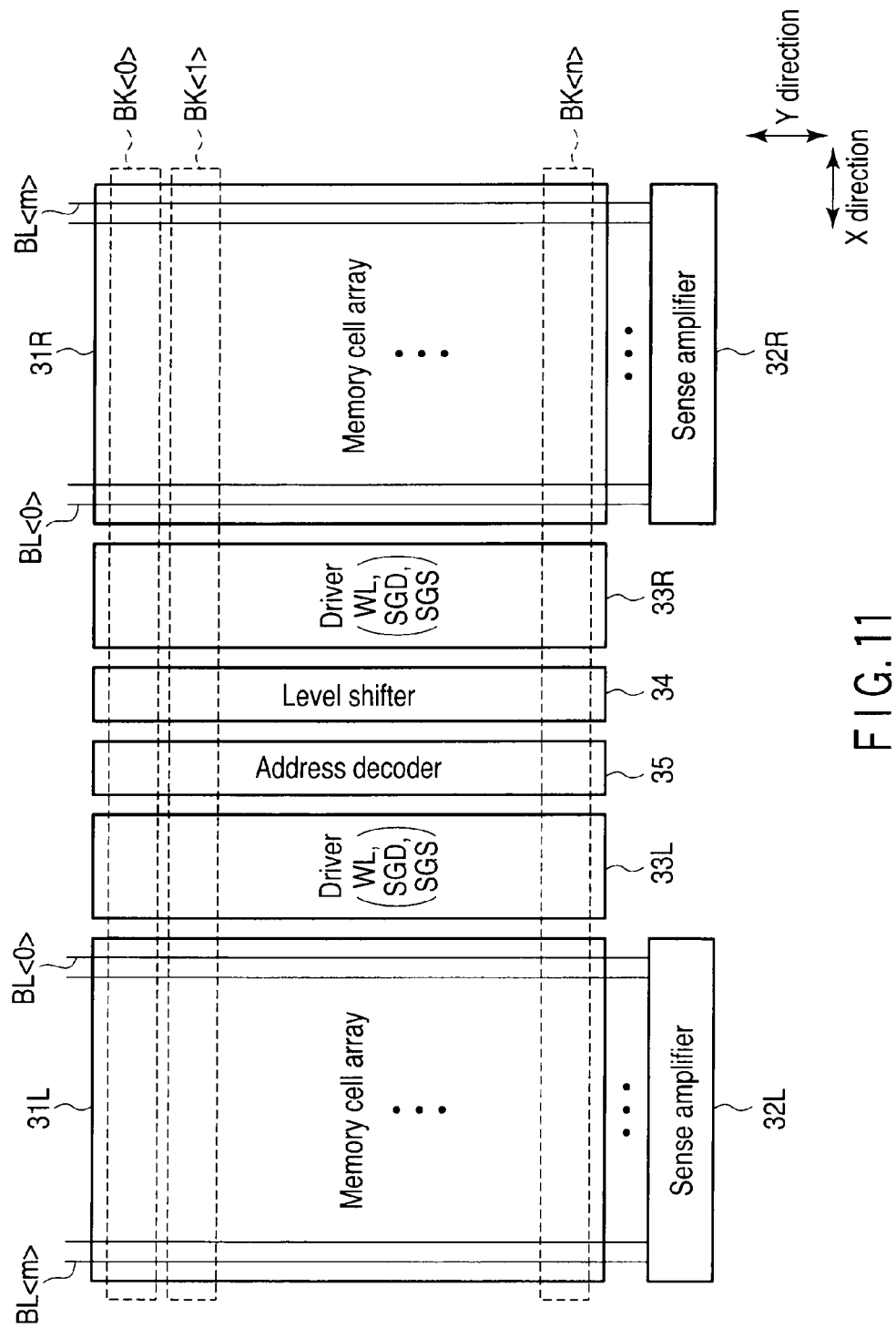
F I G. 11

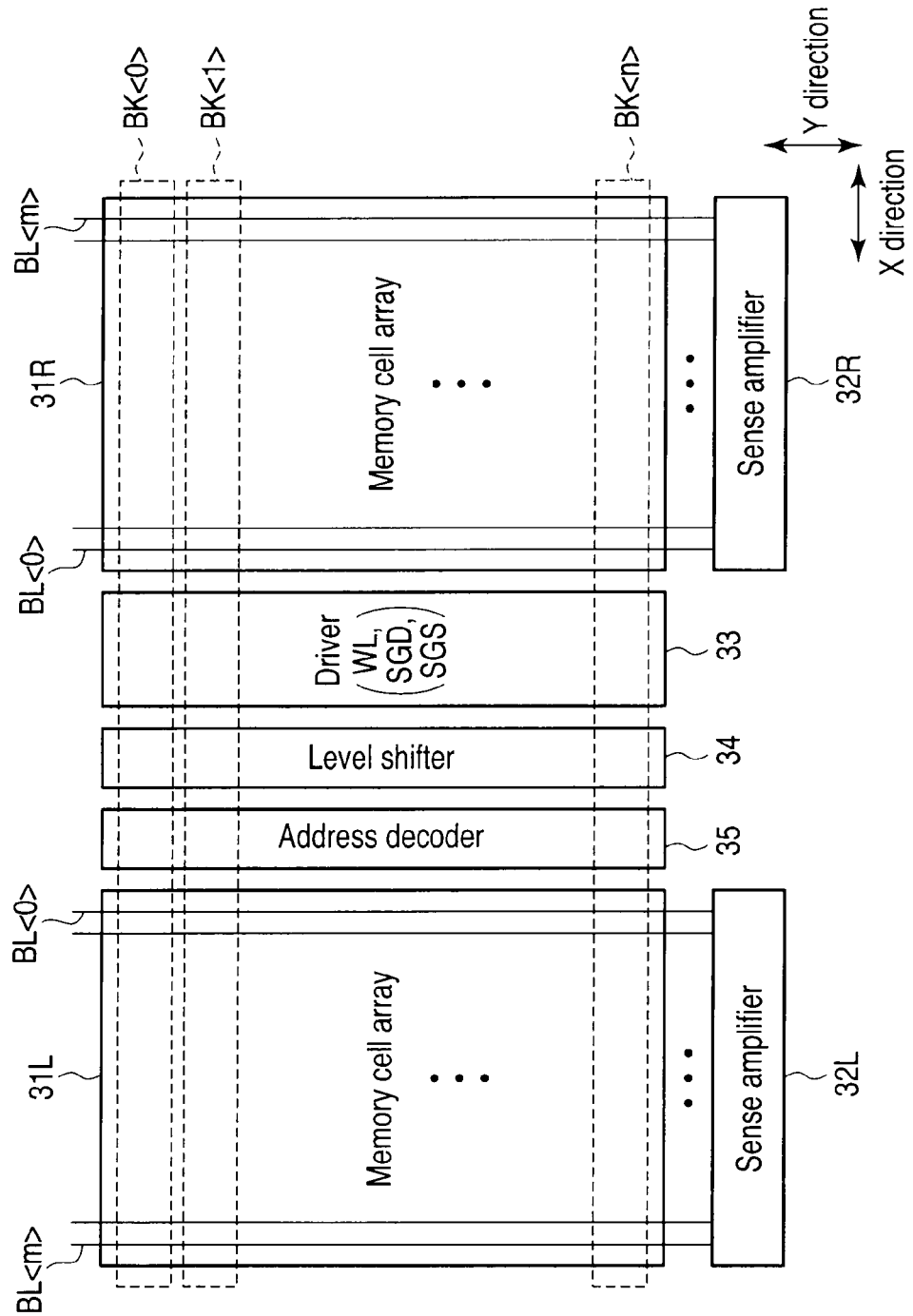
F I G. 12

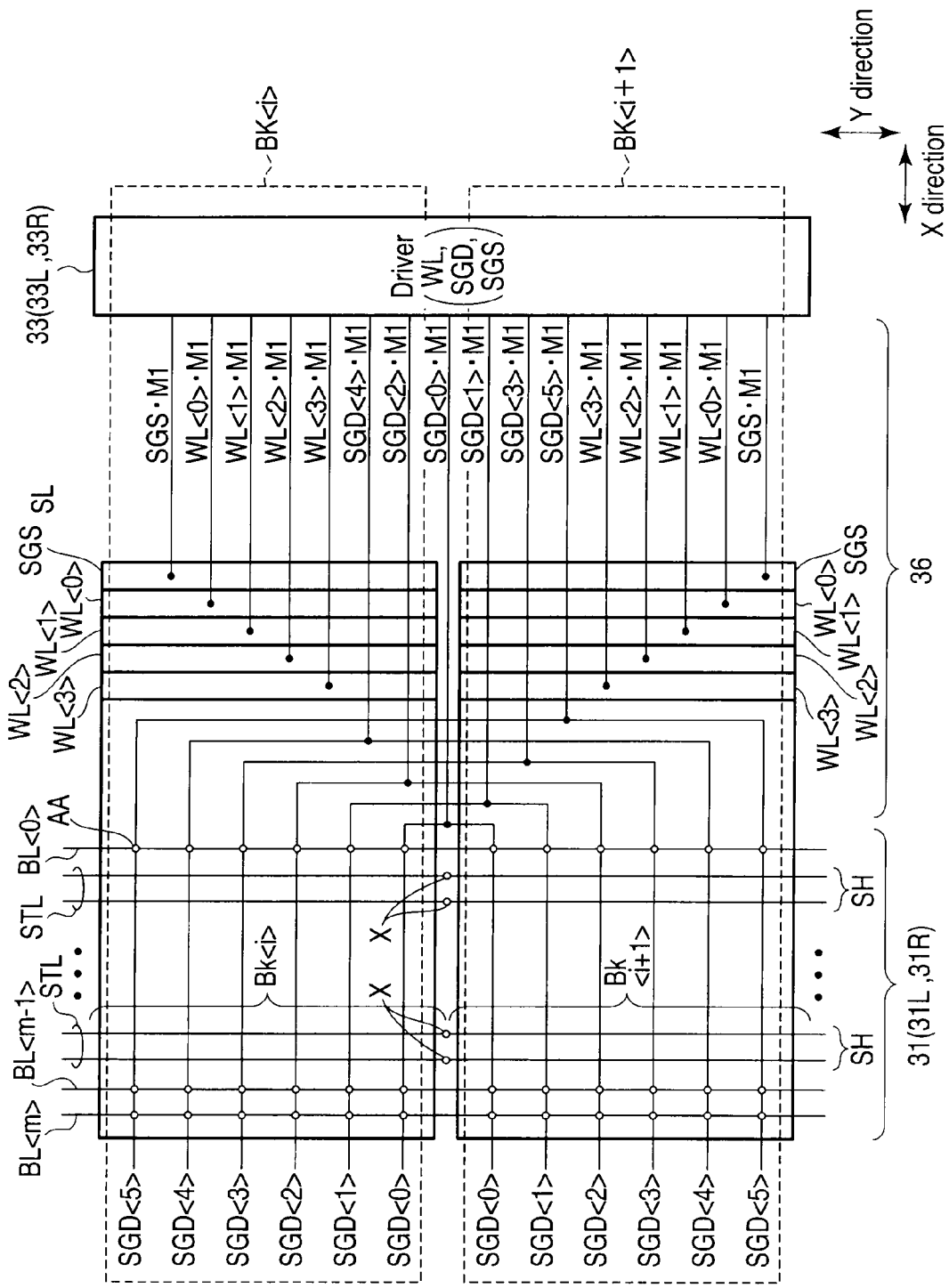
F I G. 15

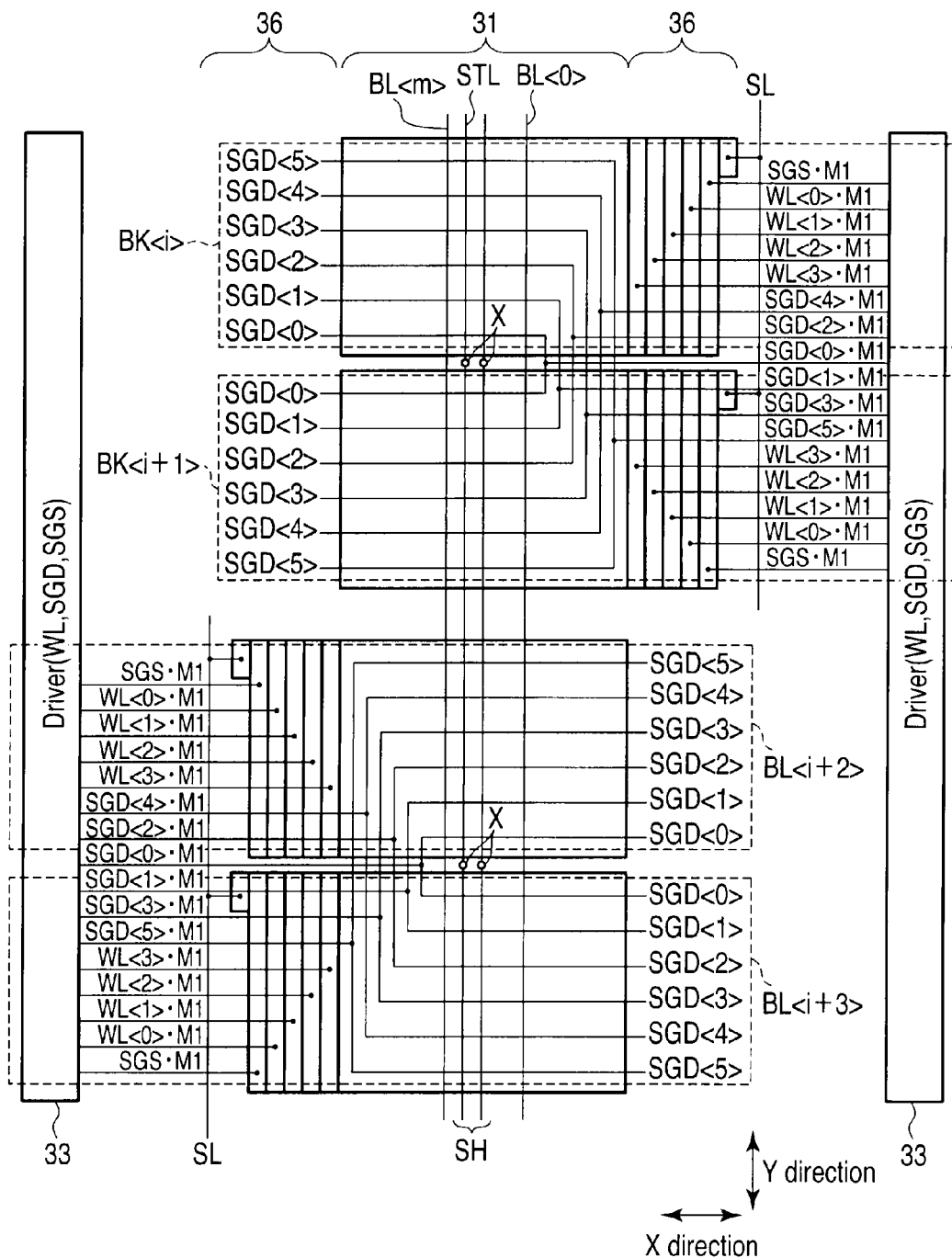
F I G. 17

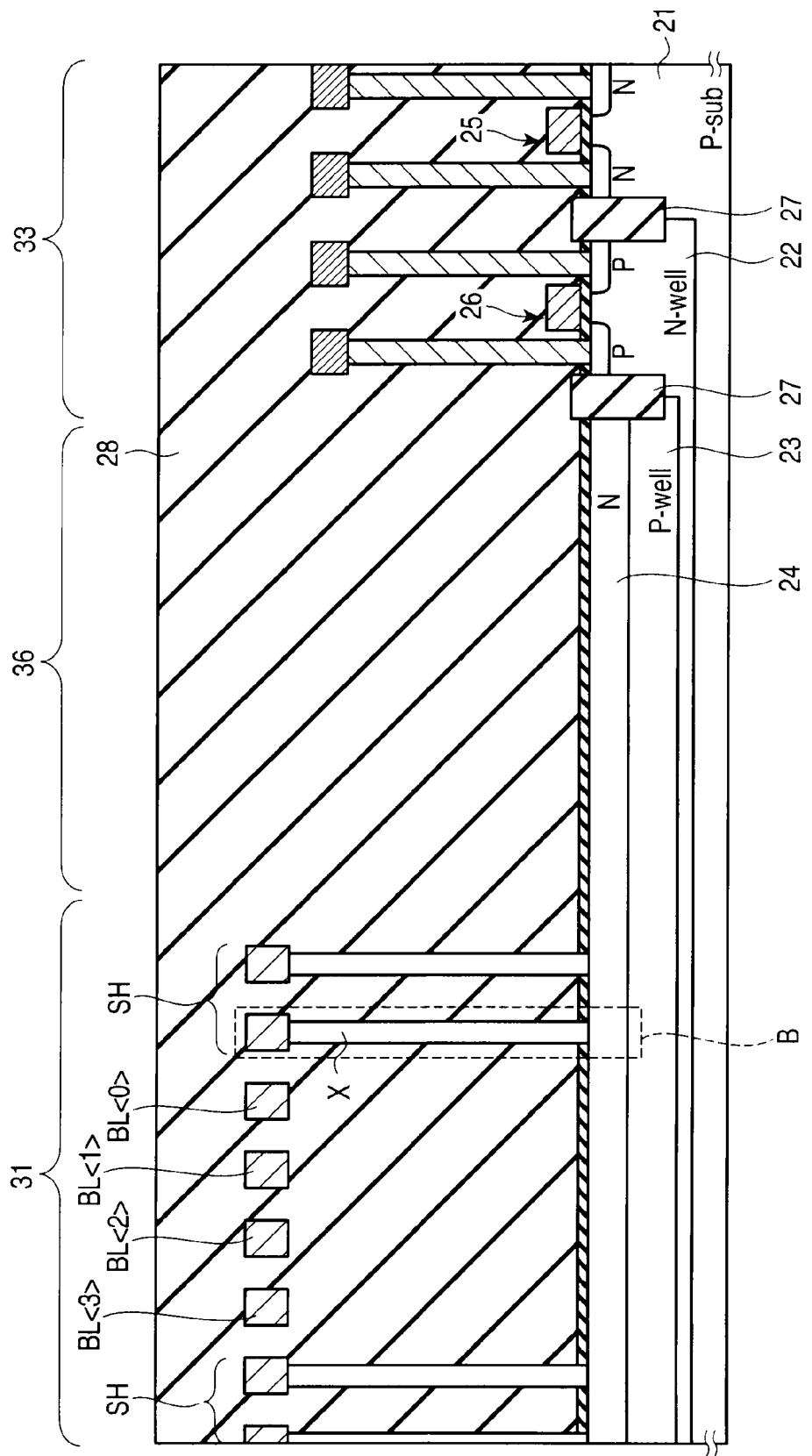
F I G. 19

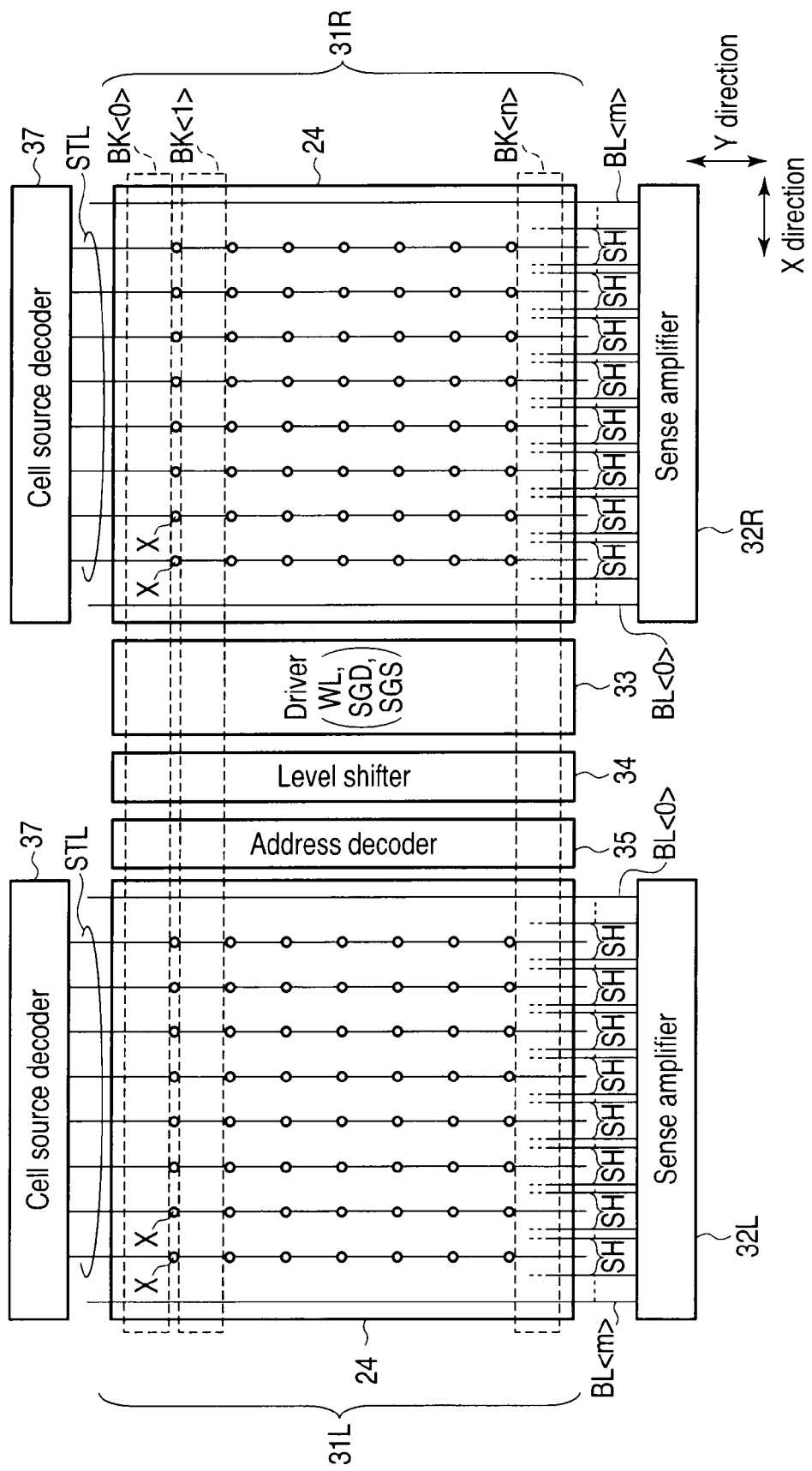
F I G. 23

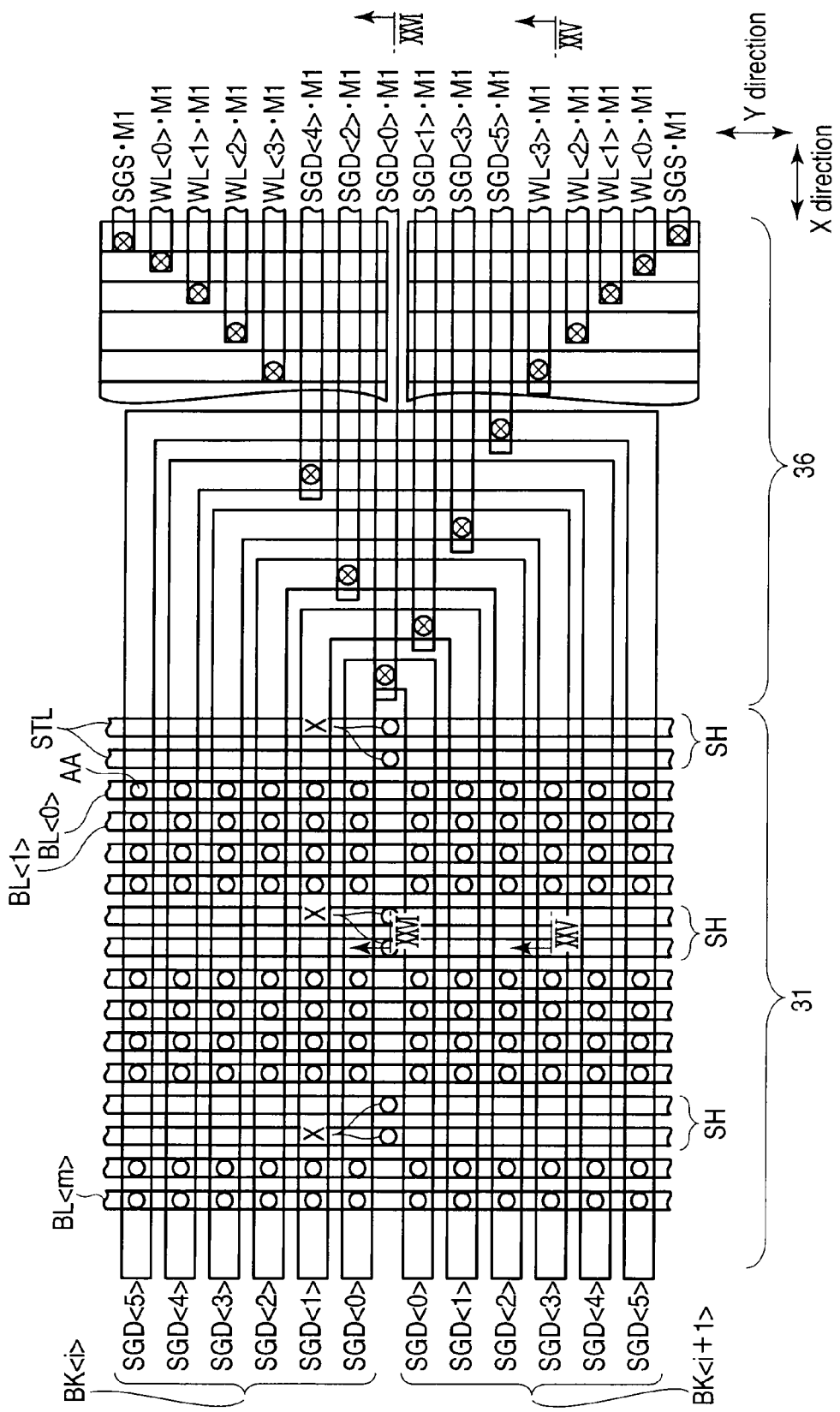
F I G. 24

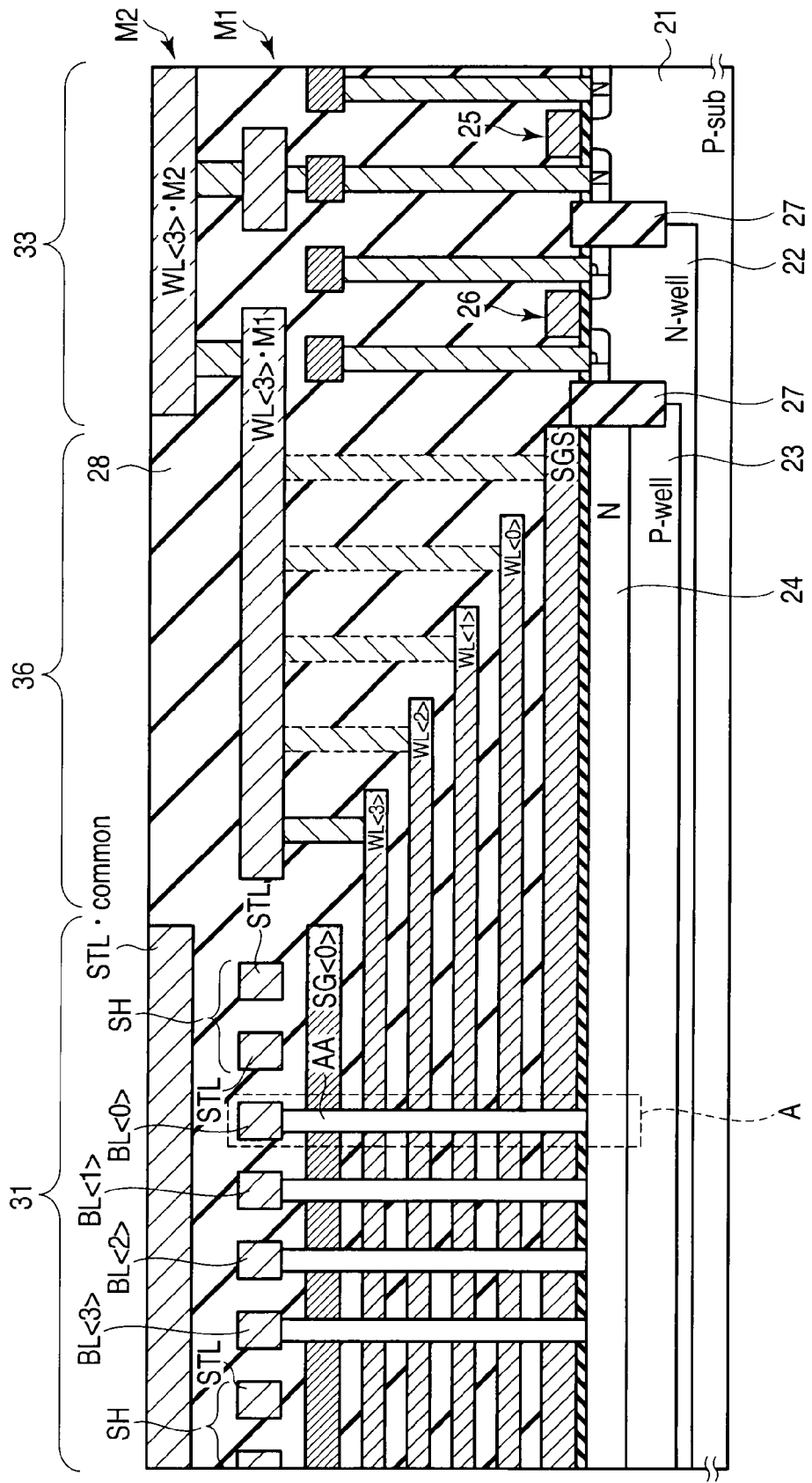
F I G. 25

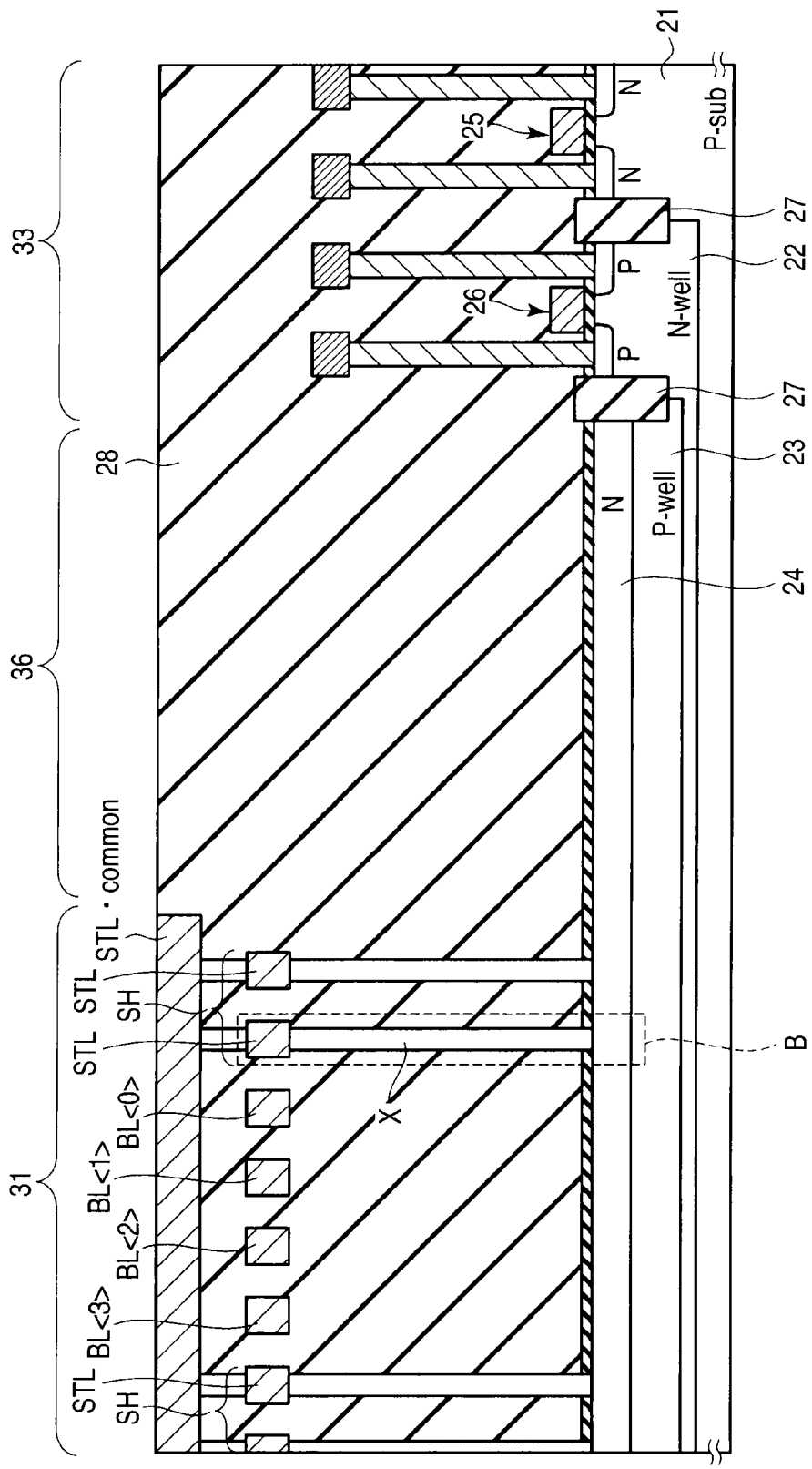
F I G. 26

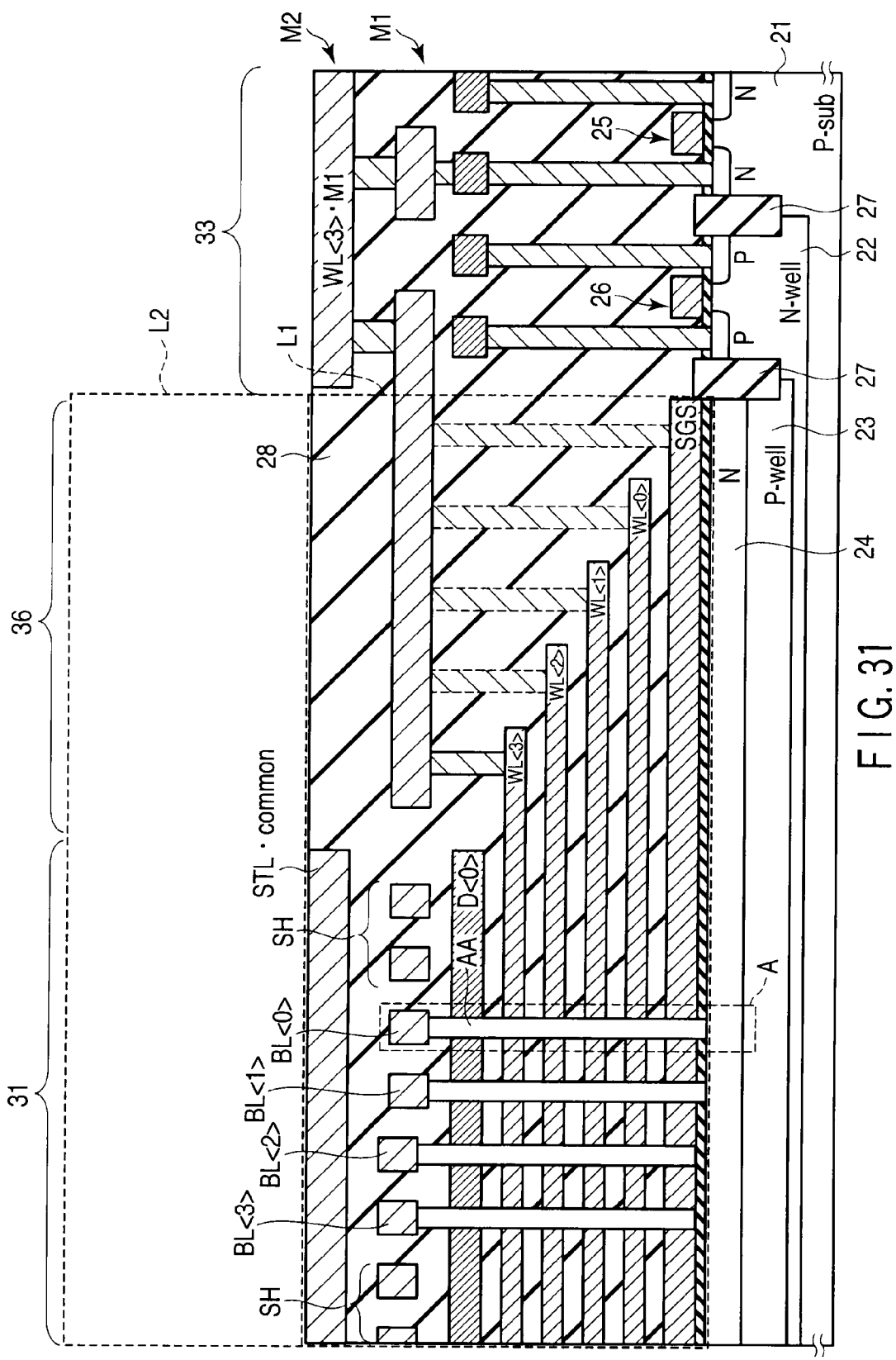
F I G. 31

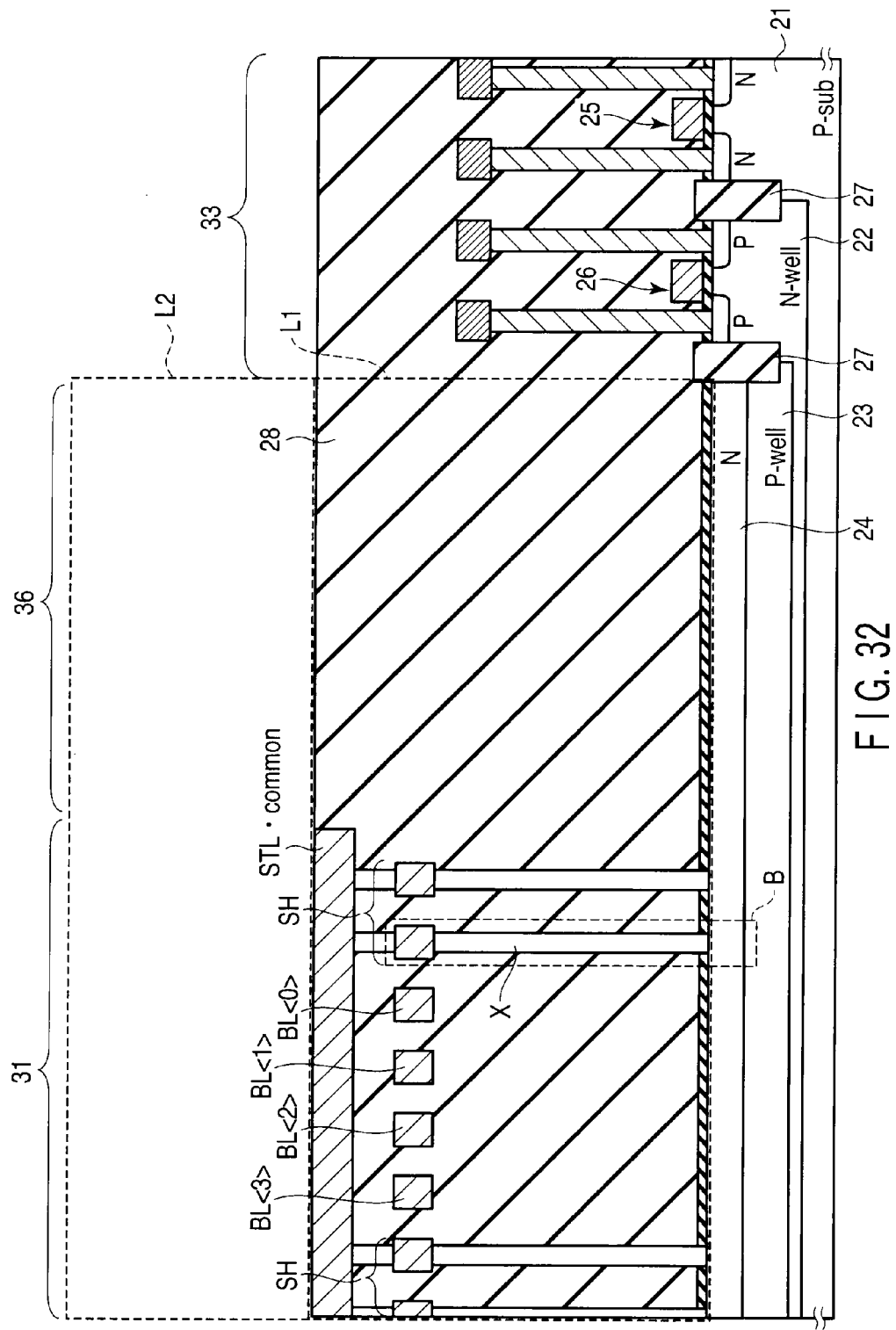
F I G. 32

THREE DIMENSIONAL STACKED NONVOLATILE SEMICONDUCTOR MEMORY

CROSS-REFERENCE TO RELATED APPLICATIONS

This application is based upon and claims the benefit of priority from prior Japanese Patent Application No. 2008-112658, filed Apr. 23, 2008, the entire contents of which are incorporated herein by reference.

BACKGROUND OF THE INVENTION

1. Field of the Invention

The present invention relates to a three dimensional stacked nonvolatile semiconductor memory.

2. Description of the Related Art

BiCS (Bit Cost Scalable) technology is known as a technology for suppressing a bit cost of a semiconductor memory by increasing the capacity thereof by a three dimensional structure (refer to, for example, "Bit Cost Scalable Technology with Punch and Plug Process for Ultra High Density Flash Memory" 2007 Symposium on VLSI Technology Digest of Technical Papers. p. 14).

A nonvolatile semiconductor memory to which the BiCS technology is applied (hereinafter, called a BiCS memory) has a feature in that it not only has a three dimensional structure but makes bit cost scalability possible so that a bit cost can be reduced in proportion to an increase of the number of stacked layers by devising a device structure and a process technology.

In, for example, a NAND flash memory to which the BiCS technology is applied (hereinafter, called a BiCS-NAND flash memory), a memory capacity, which greatly exceeds the limit of the memory capacity of a NAND flash memory having a two-dimensional structure, can be realized by increasing the number of cells in a longitudinal direction which comprise a NAND column by increasing the number of stacked layers.

However, since the BiCS memory which is represented by a BiCS-NAND flash memory has a unique device structure, there are many problems to be solved to practically use the BiCS memory.

An unstable potential of a source diffusion layer is exemplified as one of the problems.

In the BiCS memory, a cell unit comprising a memory cell array is formed on side surfaces of columnar semiconductors extending in a direction longitudinal to a semiconductor substrate. Accordingly, a source diffusion layer, which is common to blocks, is formed in the semiconductor substrate just under the blocks. Since it is difficult to dispose a contact area of the source diffusion layer in the memory cell array, the contact area is ordinarily formed outside of the memory cell array to connect the source diffusion layer to a source line.

However, in this case, since the contact area is formed outside of the memory cell array, a phenomenon such as floating of a source potential and the like is generated in the source diffusion layer by the resistance of the source diffusion layer, which makes it difficult to stabilize the potential of the source diffusion layer. Thus, the phenomenon acts as an unstable factor in, for example, a read operation.

BRIEF SUMMARY OF THE INVENTION

A three dimensional stacked nonvolatile semiconductor memory according to an aspect of the present invention comprises a semiconductor substrate, a memory cell array comprised of first and second blocks disposed on the semiconductor substrate side by side in a first direction, and a first driver disposed on one end of the memory cell array in a second direction orthogonal to the first direction.

Each of the first and second blocks is comprised of at least three conductive layers stacked on the semiconductor substrate by being insulated from each other, a bit line disposed on the at least three conductive layers by being insulated therefrom, and columnar semiconductors having lower ends connected to the semiconductor substrate and upper ends connected to the bit line and passing through the at least three conductive layers.

An uppermost layer of the at least three conductive layers is comprised of first select gate lines extending in the second direction, a lowermost layer of the at least three conductive layers is a second select gate line, remaining conductive layers excluding the uppermost layer and the lowermost layer of the at least three conductive layers are a word line, and remaining conductive layers excluding the uppermost layer of the at least three conductive layers have a plate shape whose width in the first direction is larger than the width in the first direction of the first select gate lines.

Select gate transistors are comprised of the first select gate lines and the columnar semiconductors, and the second select gate line and the columnar semiconductors, respectively and memory cells are comprised of the word line and the columnar semiconductors, respectively.

A source diffusion layer, which is common to the first and second blocks, is disposed in the semiconductor substrate, and a contact plug, which has a lower end connected to the source diffusion layer and an upper end connected to a source line disposed above the at least three conductive layers, is interposed between the first and second blocks.

BRIEF DESCRIPTION OF THE SEVERAL VIEWS OF THE DRAWING

FIG. 1 is a bird's eye view of a BiCS-NAND flash memory;
FIG. 4 is a sectional view taken along line IV-IV of FIG. 2;
FIG. 5 is a structure view of a NAND cell unit;
FIG. 9 is a view showing a first example of a block layout;
FIG. 10 is a view showing a second example of the block layout;
FIG. 11 is a view showing a third example of the block layout;
FIG. 12 is a view showing a fourth example of the block layout;
FIG. 15 is a conceptual view of a layout of a second embodiment;
FIG. 17 is a conceptual view of a layout of other embodiment.

FIG. 19 is a sectional view taken along line XIX-XIX of FIG. 16;

FIG. 23 is a plan view showing an overall structure of the shunt area;

FIG. 24 is a plan view showing a layout of a first modification;

FIG. 25 is a sectional view taken along line XXV-XXV of FIG. 24;

FIG. 26 is a sectional view taken along line XXVI-XXVI of FIG. 24;

FIG. 31 is a sectional view showing a structure of a third modification; and

FIG. 32 is a sectional view showing a structure of the third modification.

DETAILED DESCRIPTION OF THE INVENTION

Figure 2:
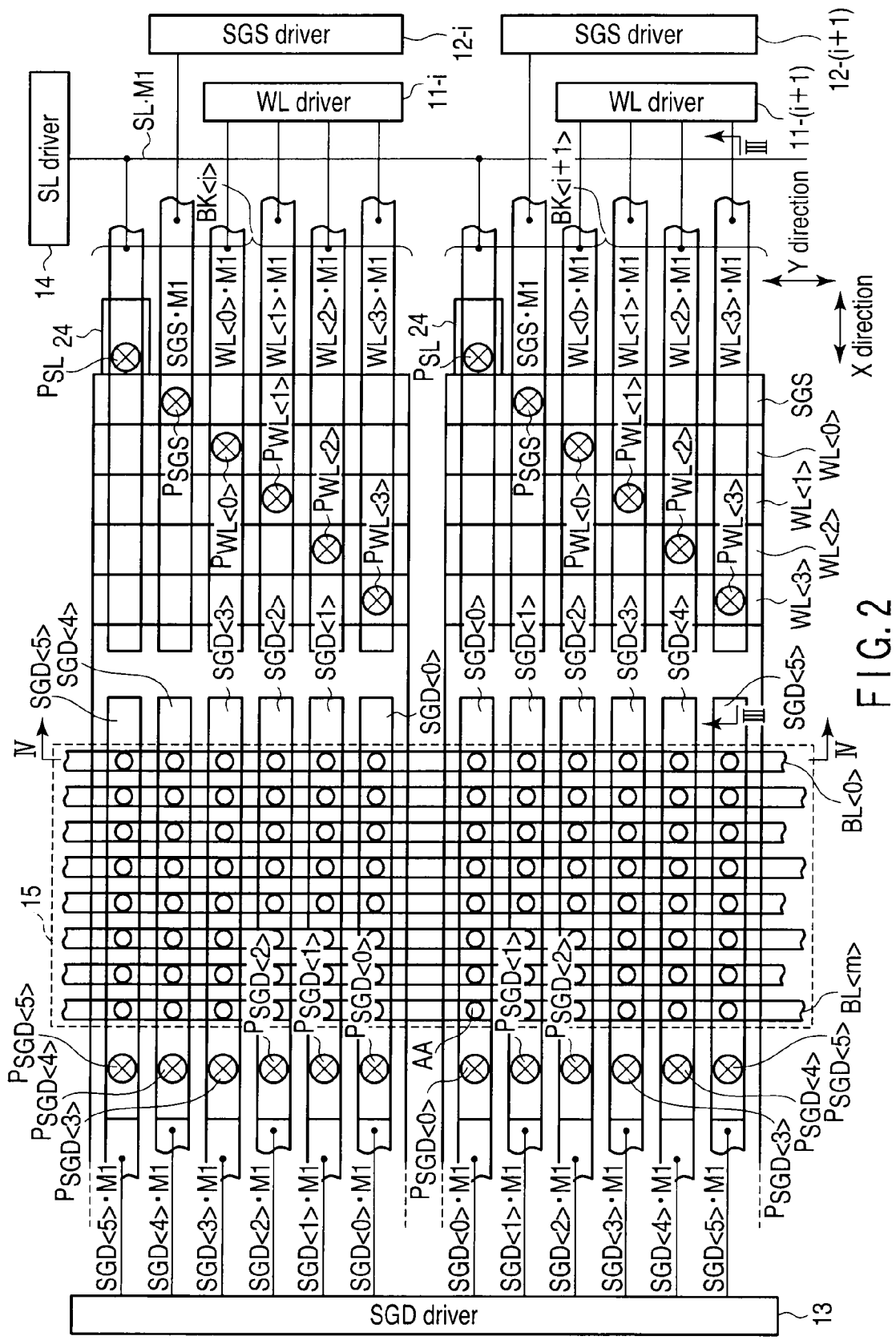
FIG. 2 is a plan view of the BiCS-NAND flash memory.

A three dimensional stacked nonvolatile semiconductor memory of an aspect of the present invention will be described below in detail with reference to the accompanying drawing.

1. Outline

Examples of the present invention propose a layout of a shunt area making use of a structure specific to a BiCS memory. Specifically, contact plugs are interposed between two blocks in a memory cell array, the contact plugs having lower ends connected to a source diffusion layer and upper ends connected to a source line disposed above at least three conductive layers.

It is only necessary to form a shunt area in the memory cell array to supply a potential to a source diffusion layer to prevent an unstable potential of the source diffusion layer caused by the structure specific to the BiCS memory, i.e., a structure of the source diffusion layer formed flat just under the memory cell array comprised of blocks. However, to form the shunt area in the memory cell array, a layout of the shunt area must be devised.

Examples of the present invention propose a layout of a shunt area making use of the structure specific to the BiCS memory.

An increase of the area of the memory cell array in a lateral direction caused by the shunt area can be minimized by forming the contact plugs between the two blocks in the memory cell array. Further, according to the layout, since the contact areas can be periodically formed to the source diffusion layer in, for example, the memory cell array, the potential of the source diffusion layer can be stabilized as compared with when the contact area is formed only outside of the memory cell array.

2. BiCS Memory (1) Basic Structure

First, a basic structure of a BiCS memory will be explained.

FIG. 1 shows a bird's eye view of a BiCS-NAND flash memory.

The NAND flash memory is comprised of blocks each of which acts, for example, as a unit to be erased. Here, two blocks BK<i>, BK<i+1> are shown in the figure.

A source diffusion layer 24 formed in a semiconductor substrate is shared by, for example, all the blocks. The source diffusion layer 24 is connected to a source line SL•M1 through a contact plug $P_{SL}$. Further, at least three conductive layers (in the example, six-layer structure) comprised of, for example, conductive polysilicon are laminated on the source diffusion layer 24.

The remaining five conductive layers excluding the uppermost layer are formed in a plate shape, respectively in the one block BK<i+1> as well as the ends thereof in the X-direction are formed stepwise so that they are in contact with the respective conductive layers. A lowermost layer acts as a select gate line SGS on the source line side, and the remaining four conductive layers excluding the lowermost and uppermost layers act as word lines WL<0>, WL<1>, WL<2>, and WL<3>.

The uppermost layer is comprised of line-shaped conductive wires extending in the X-direction. Six conductive wires, for example, are disposed in the one block BK<i+1>. The six conductive wires, for example, of the uppermost layer act as select gate lines SGD<0>, . . . , SGD<5> on a bit line side.

Active layers (active areas) AA for comprising a NAND cell unit are formed columnarly in a Z-direction (direction vertical to the front surface of the semiconductor substrate) so that they reach the source diffusion layer 24 passing through the conductive layers.

The upper ends of the active layers AA are connected to bit lines BL<0>, . . . , BL<m> extending in a Y-direction. Further, the select gate line SGS on the source line side is connected to an interconnect line SGS•M1 extending in the X-direction through a contact plug $P_{SGS}$, and the word lines WL<0>, WL<1>, WL<2>, and WL<3> are connected to interconnect lines WL<0>•M1, WL<1>•M1, WL<2>•M1, and WL<3>•M1 extending in the X-direction through contact plugs $P_{WL<0>}$, $P_{WL<1>}$, $P_{WL<2>}$, $P_{WL<3>}$, respectively.

Further, select gate lines SGD<0>, . . . , SGD<5> on the bit line side are connected to interconnect lines SGD<0>•M1, . . . , SGD<5>•M1 extending in the X-direction through contact plugs $P_{SGD<0>}$, . . . , $P_{SGD<5>}$, respectively.

The bit lines BL<0>, . . . , BL<m> and the interconnect lines SGS•M1, WL<0>•M1, WL<1>•M1, WL<2>•M1, and WL<3>•M1, SGD<0>•M1, . . . , SGD<5>•M1 are comprised of, for example, metal.

FIG. 2 shows a plan view of the BiCS-NAND flash memory of FIG. 1.

The columnar active layers AA are disposed in an array-state when viewed from the upper surface of the semiconductor substrate and comprise a memory cell array 15. Although the NAND cell unit is formed in each of the active layers AA, it will be described later in detail.

WL drivers 11-*i* and 11(*i*+1) are connected to the word lines WL<0>, WL<1>, WL<2>, and WL<3> through the interconnect lines WL<0>•M1, WL<1>•M1, WL<2>•M1, WL<3>•M1 and drive them in write, in read, and in erase.

SGS drivers 12-*i* and 12-(*i*+1) are connected to the select gate line SGS on the source line side through the interconnect line SGS•M1. A SGD driver 13 is connected to the select gate lines SGD<0>, . . . , SGD<5> on the bit line side through the interconnect lines SGD<0>•M1, . . . , SGD<5>•M1.

An SL driver 14 is connected to the source diffusion layer 24 through the source line SL•M1.

In this layout, the WL drivers 11-*i* and 11-(*i*+1) and the SGS drivers 12-*i* and 12-(*i*+1) are disposed on one end side of the memory cell array 15 in the X-direction, and the SGD driver 13 is disposed on the other end side of the memory cell array 15 in the X-direction in consideration of an increase of the number of transistors comprising the drivers as a peripheral circuit.

Figure 3:
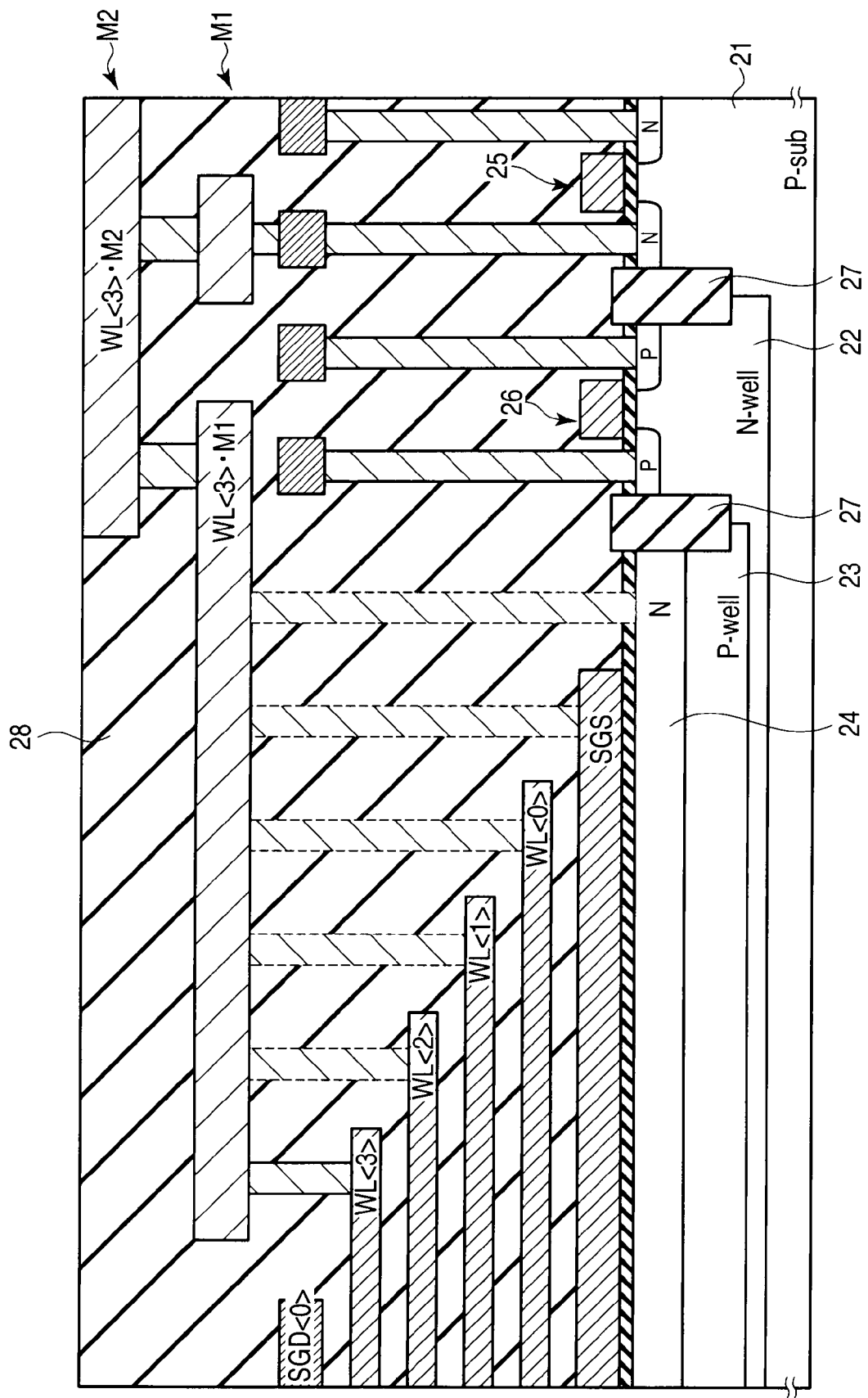
FIG. 3 is a sectional view taken along line III-III of FIG. 2.

FIG. 3 is a sectional view taken along line III-III of FIG. 2.

An N-type well region (N-well) 22 and a P-type well region (P-well) 23 are formed in a P-type semiconductor substrate (P-sub) 21. The source diffusion layer 24 is an N-type diffusion layer and formed in the P-type well region 23.

An N-channel FET (for example, N-channel MOSFET) 25 is formed in the P-type semiconductor substrate 21, and a P-channel FET (for example, P-channel MOSFET) 26 is formed in the N-type well region 22. These transistors comprise the peripheral circuit (for example, the drivers) formed in a peripheral portion of a memory cell array.

The select gate line SGS on the source line side and the word lines WL<0>, WL<1>, WL<2>, and WL<3> are connected to the transistors comprising the drivers through the interconnect line in a first metal layer M1 and through an interconnect line in a second metal layer M2 on the first metal layer M1.

To explain the word line WL<3> as an example, the word line WL<3> is connected to the N-channel FET 25 comprising a word line driver through the interconnect line WL<3>•M1 in the first metal layer M1 and through an interconnect line WL<3>•M2 in the second metal layer M2 on the first metal layer M1.

Here, gate electrodes of the N-channel FET 25 and the P-channel FET 26 are formed simultaneously with, for example, the select gate line SGS on the source line side.

That is, the gate electrodes of the N-channel FET 25 and the P-channel FET 26 have the same structure and the same thickness as those of the select gate line SGS on the source line side.

FIG. 4 is a sectional view taken along line IV-IV of FIG. 2.

One ends (lowermost portions) of the active layers (active areas) AA are connected to the source diffusion layer 24 passing through the select gate line SGS on the source line side, the word lines WL<0>, WL<1>, WL<2>, and WL<3>, and the select gate lines SGD<0>, . . . , SGD<5> on the bit line side, and the other ends (uppermost portions) thereof are connected to a bit line BL<0>.

The active layers AA are formed columnarly in the Z-direction (direction vertical to the front surface of the semiconductor substrate), and the NAND cell unit NAND is formed in each of the active layers AA.

FIG. 5 shows an example of a structure of the NAND cell unit NAND.

A memory cell MC has a MONOS structure.

The MONOS structure means a memory cell structure having a charge accumulation layer comprised of an insulation material such as nitride. The charge accumulation layer has a multilayer structure (charge trap layers), and ONO (oxide/nitride/oxide) is exemplified here.

A select gate transistor ST has the same structure as that of, for example, the memory cell MC.

However, a gate insulation film of the select gate transistor ST may have a structure different from that of the memory cell MC, i.e., may have a structure that includes no charge accumulation layer (for example, a single silicon oxide film).

Figure 6:
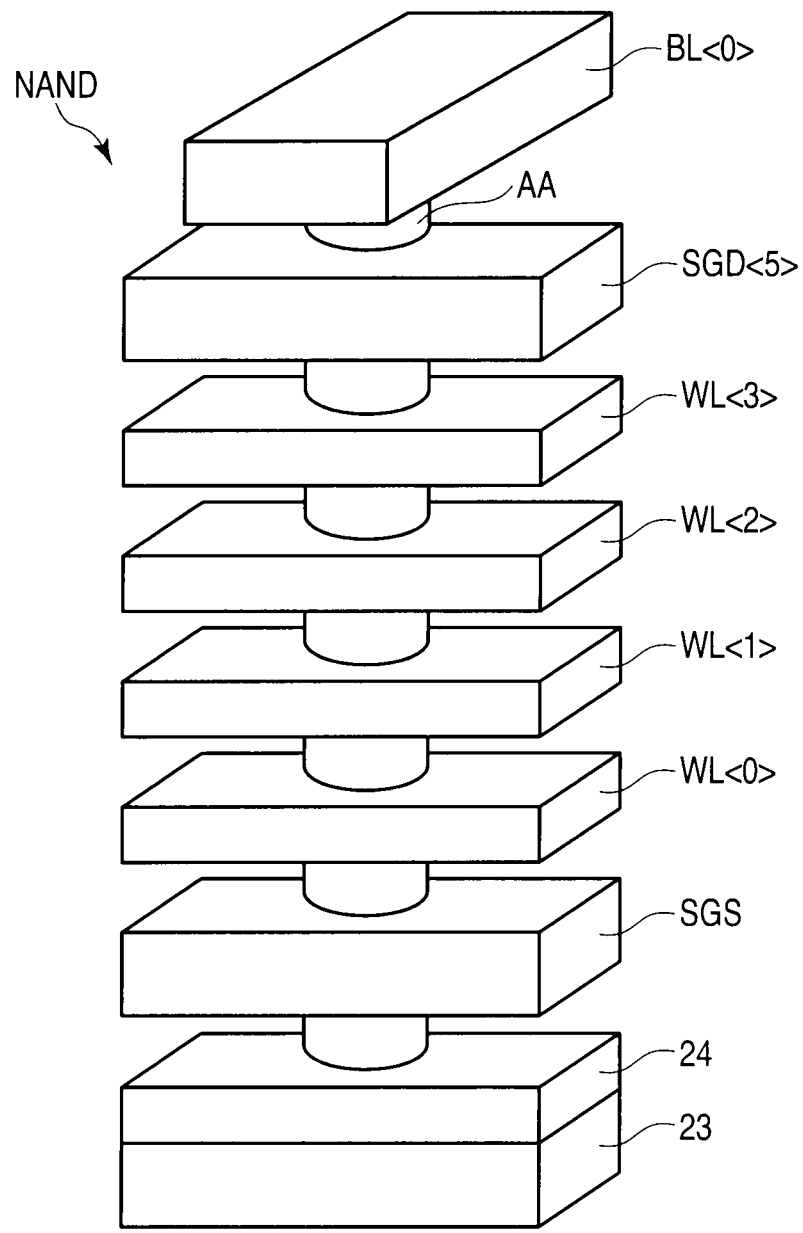
FIG. 6 is a bird's eye view of the NAND cell unit.

FIG. 6 shows a bird's eye view of the NAND cell unit.

One of the features of the NAND cell unit having a three dimensional structure resides in that each of the select gate line SGS on the source line side, the word lines WL<0>, WL<1>, WL<2>, and WL<3>, and the select gate lines SGD<0>, . . . , SGD<5> on the bit line side has a structure for surrounding each of the side surfaces of the columnar active layers AA.

Accordingly, even if the active layers AA are made, for example, thinner and a larger number of the active layers AA are formed on the semiconductor substrate to increase a capacity, a force for driving the transistors comprising the NAND cell unit can be sufficiently secured.

Figure 7:
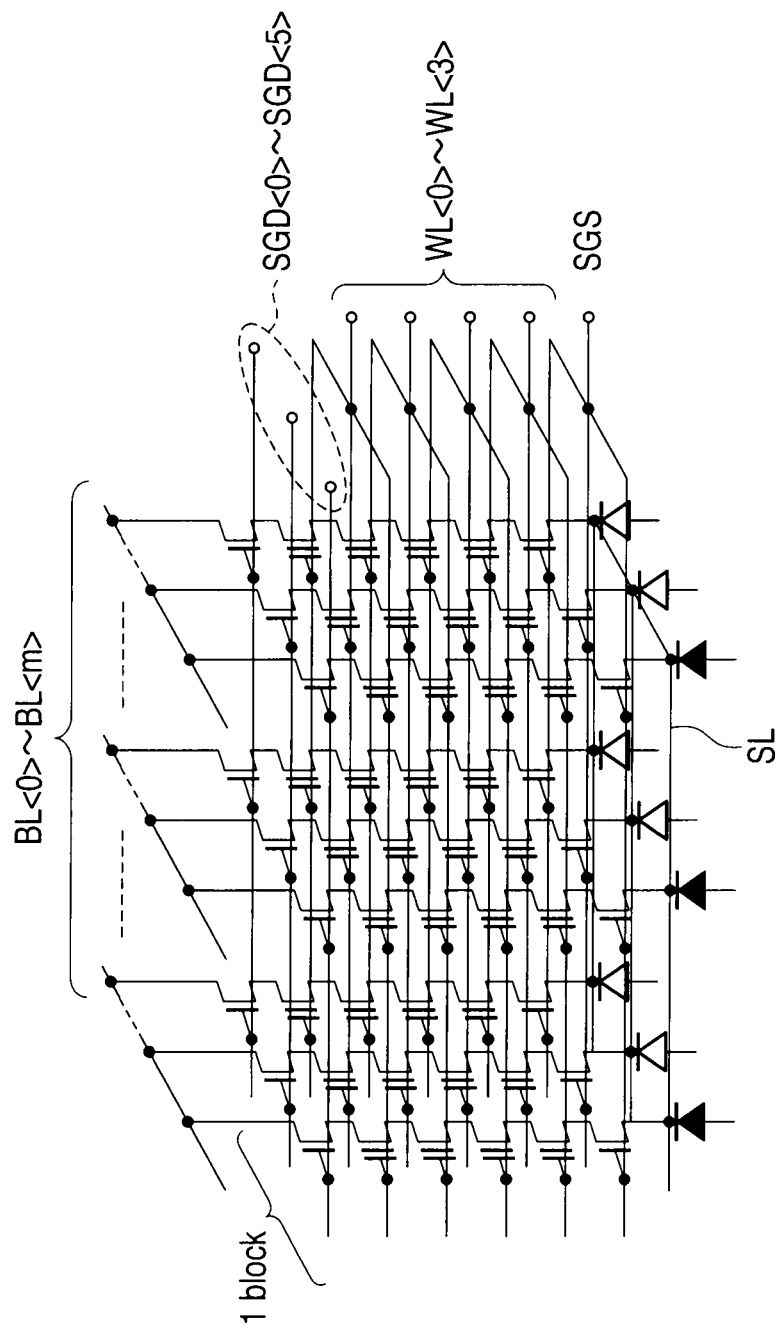
FIG. 7 is an equivalent circuit view of a memory cell array.

FIG. 7 shows an equivalent circuit of the memory cell array.

Since the BiCS-NAND flash memory has a three dimensional structure, the equivalent circuit is shown in a three dimension.

A larger number of memory cells comprising a NAND column can more contribute to an increase of the capacity. However, as the number of the memory cells comprising the NAND column is more increased, there is a possibility that the characteristics of the memory cells are dispersed in a manufacturing process from the characteristics of a BiCS structure.

When the dispersion of the characteristics is taken into consideration, the NAND column is comprised of a smaller number of the memory cells (for example, four memory cells, eight memory cells, and the like). Further, the same structure may be stacked on a structure shown by the equivalent circuit of FIG. 7.

Figure 8:
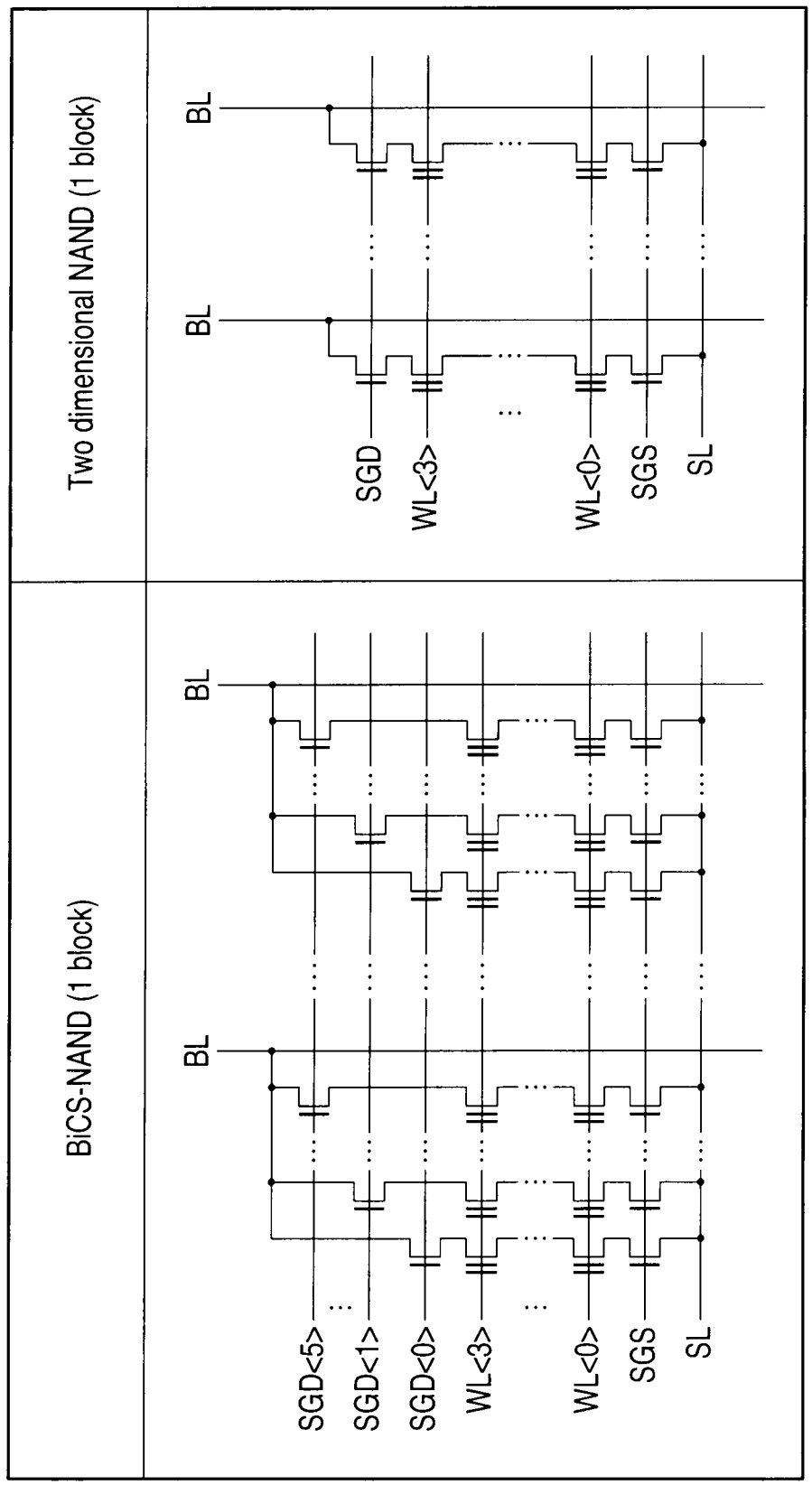
FIG. 8 is a comparative view comparing a BiCS-NAND with a two-dimensional NAND.

FIG. 8 is a view showing BiCS-NAND in comparison with two-dimensional NAND.

In the NAND flash memory having the two-dimensional structure (two-dimensional NAND), one NAND cell unit in one block is connected to one bit line BL, whereas in the BiCS-NAND, NAND cell units in one block are connected to one bit line BL.

Accordingly, as explained below, one of the cell units in the one block connected to the one bit line BL is selected by the select gate lines SGD<0>, . . . , SGD<5> on the bit line side in a write operation and a read operation.

(2) Basic Operations

Basic operations of the BiCS-NAND flash memory of FIGS. 1 to 8 will be explained.

Since the basic write, read, and erase operations are the same as those of the NAND flash memory having the two-dimensional structure, matters specific to the BiCS-NAND flash memory will be explained here.

The concept of one block of the BiCS-NAND flash memory is different from that of the NAND flash memory having the two-dimensional structure.

Although the one NAND cell unit in the one block is connected to the one bit line BL in the NAND flash memory having the two-dimensional structure, the NAND cell units in the one block are connected to the one bit line BL in the BiCS-NAND flash memory.

For example, in the plan view of FIG. 2, six NAND cell units (corresponding to the number of the active layers AA in the figure) in the block BK<i+1> are connected to the bit line BL<0>.

Accordingly, in the write operation and the read operation, one of the six NAND cell units in the block BK<i+1> connected to the bit line BL<0> must be selected.

The selection is performed by select gate lines SGD<0>, . . . , SGD<5> on the bit line side. The select gate lines SGD<0>, . . . , SGD<5> on the bit line side are individually connected to six NAND cell units in the Y-direction in the block BK<i+1>.

The erase operation is performed collectively to, for example, all the memory cells in one block like the NAND flash memory having the two-dimensional structure.

The BiCS-NAND flash memory can be applied to both a binary memory, which stores binary data in one memory cell, and a multi-level memory which stores multi-level data having a ternary or more value in one memory cell.

3. Embodiments

Embodiments of the present invention will be explained.

(1) Block Layout

FIG. 9 shows a first example of a block layout of a BiCS memory.

The block layout corresponds to, for example, the BiCS-NAND flash memory of FIG. 1 and has a feature in that a select gate line driver on a bit line side is disposed on one end of a memory cell array and a word line driver and a select gate line driver on a source line side are disposed on the other end of the memory cell array.

A driver 33L, a level shifter 34L, and an address decoder 35L are disposed on one end of the memory cell array 31 in an X-direction (on a left side). The driver 33L is a driver for driving a select gate line SGD on the bit line side and includes a transfer transistor.

A driver 33R, a level shifter 34R, and an address decoder 35R are disposed on the other end of the memory cell array 31 in the X-direction (on a right side). The driver 33R is a driver for driving a word line WL and a select gate line SGS on the source line side and includes a transfer transistor.

Further, a sense amplifier 32 is disposed on one end of the memory cell array 31 in a Y-direction. Bit lines BL<0>, . . . , BL<m> extending in the Y-direction are disposed on the memory cell array 31 and connected to the sense amplifier 32.

Since the block layout corresponds to the BiCS-NAND flash memory of FIG. 1, the select gate lines SGD on the bit line side are disposed in blocks BK<0>, BL<1>, . . . , BK<n>, respectively. That is, since the area of the driver for driving the select gate lines SGD on the bit line side is increased, a select gate line driver on the bit line side is disposed on the one end of the memory cell array 31 in addition to the word line driver and the select gate line driver on the source line side disposed on the other end of the memory cell array 31.

FIG. 10 shows a second example of the block layout of the BiCS memory.

A feature of the second example resides in that drivers 33 for driving a word line WL, a select gate line SGS on a source line side, and a select gate line SGD on a bit line side are disposed together on one end of a memory cell array 31 in comparison with the first example.

The drivers 33, a level shifter 34, and an address decoder 35 are disposed on one end of the memory cell array 31 in the X-direction (on a left side). The drivers 33 are drivers for driving the word line WL, the select gate line SGS on the source line side, and the select gate line SGD on the bit line side and include transfer transistors.

Further, a sense amplifier 32 is disposed on one end of the memory cell array 31 in the Y-direction. Bit lines BL<0>, . . . , BL<m> extending in the Y-direction are disposed on the memory cell array 31 and connected to the sense amplifier 32.

Since the drivers 33 for driving the word line WL, the select gate line SGS on the source line side and the select gate line SGD on the bit line side are disposed together as described above, an address decoder 34 and a level shifter 35 can be also disposed together at the same position. As a result, a layout of a peripheral circuit can be made efficiently.

However, in the above block layout, when the size of the memory cell array 31 is increased and further a memory cell is miniaturized and the word line WL, the select gate line SGS on the source line side and the select gate line SGD on the bit line side are disposed at narrow pitches, a problem arises in that a signal is delayed by a parasitic capacitance.

In particular, in the BiCS memory, the word line WL and the select gate line SGS on the source line side are formed in a plate shape. Accordingly, coupling noise is caused by an increase of a parasitic capacitance between the conductive wires.

FIG. 11 shows a third example of the block layout of the BiCS memory.

A feature of the third example resides in that two memory cell arrays 31L and 31R are disposed in comparison with the second example. Since disposition of the two memory cell arrays 31L and 31R can reduce the lengths of a word line WL, a select gate line SGS on a source line side, and a select gate line SGD on a bit line side in each memory cell array, a signal delay and coupling noise can be suppressed.

The memory cell arrays 31L and 31R are disposed in the X-direction side by side. Drivers 33L and 33R, a level shifter 34, and an address decoder 35 are interposed between the memory cell arrays 31L and 31R. The drivers 33L and 33R drive the word line WL, the select gate line SGS on the source line side, and the select gate line SGD on the bit line side and include transfer transistors.

Further, sense amplifiers 32L and 32R are disposed on one ends of the memory cell arrays 31L and 31R in the Y-direction. Bit lines BL<0>, . . . , BL<m> extending in the Y-direction are disposed on the memory cell arrays 31L and 31R and connected to the sense amplifiers 32L and 32R.

Although the level shifter 34 and the address decoder 35 are shared by the two memory cell arrays 31L and 31R in the block layout, the driver 33L is disposed in correspondence with the memory cell array 31L, and the driver 33R is disposed in correspondence with the memory cell array 31R.

A reason why the drivers 33L and 33R cannot be shared by the two memory cell arrays 31L and 31R as described above is that since the drivers are comprised of a lot of transistors, when they are shared by the memory cell arrays 31L and 31R, a layout of wirings for connecting the memory cell arrays 31L and 31R to the drivers 33L and 33R is made complex. That is, when a driver is disposed on each memory cell array, a layout of wirings is more simplified than a case that the drivers are shared by the two memory cell arrays.

FIG. 12 shows a fourth example of the block layout of the BiCS memory.

A feature of the fourth example resides in that a driver 33 for driving a word line WL, a select gate line SGS on a source line side, and a select gate line SGD on a bit line side is shared by two memory cell arrays 31L and 31R in comparison with the third example.

The driver 33 can be shared by reducing the area thereof, i.e., by reducing the number of transistors comprising the driver 33. More specifically, this is because a layout of wirings for connecting the memory cell arrays 31L and 31R to the driver 33 is not made complex by reducing the number of the transistors.

The number of the transistors comprising the driver 33 can be reduced by sharing the select gate line on the bit line side by, for example, blocks.

The memory cell arrays 31L and 31R are disposed in the X-direction side by side. The driver 33, a level shifter 34, and an address decoder 35 are interposed between the memory cell arrays 31L and 31R. The driver 33 drives the word line WL, the select gate line SGS on the source line side and the select gate line SGD on the bit line side and includes a transfer transistor.

Further, sense amplifiers 32L and 32R are disposed on one ends of the memory cell arrays 31L and 31R in the Y-direction. Bit lines BL<0>, . . . , BL<m> extending in the Y-direction are disposed on the memory cell arrays 31L and 31R and connected to the sense amplifiers 32L and 32R.

In the block layout, the driver 33, the level shifter 34, and the address decoder 35 are shared by the two memory cell arrays 31L and 31R.

Note that if the driver 33 can be shared by the two memory cell arrays 31L and 31R without making a wiring layout complex, the block layout of the fourth example will be most preferable in the first to fourth examples.

(2) Layout of Shunt Area

Examples of the present invention have a feature in that a shunt area is formed in a memory cell array. A layout of source lines and bit lines in a memory cell array and select gate lines on a bit line side will be mainly explained below.

A. First Embodiment

Figure 13:
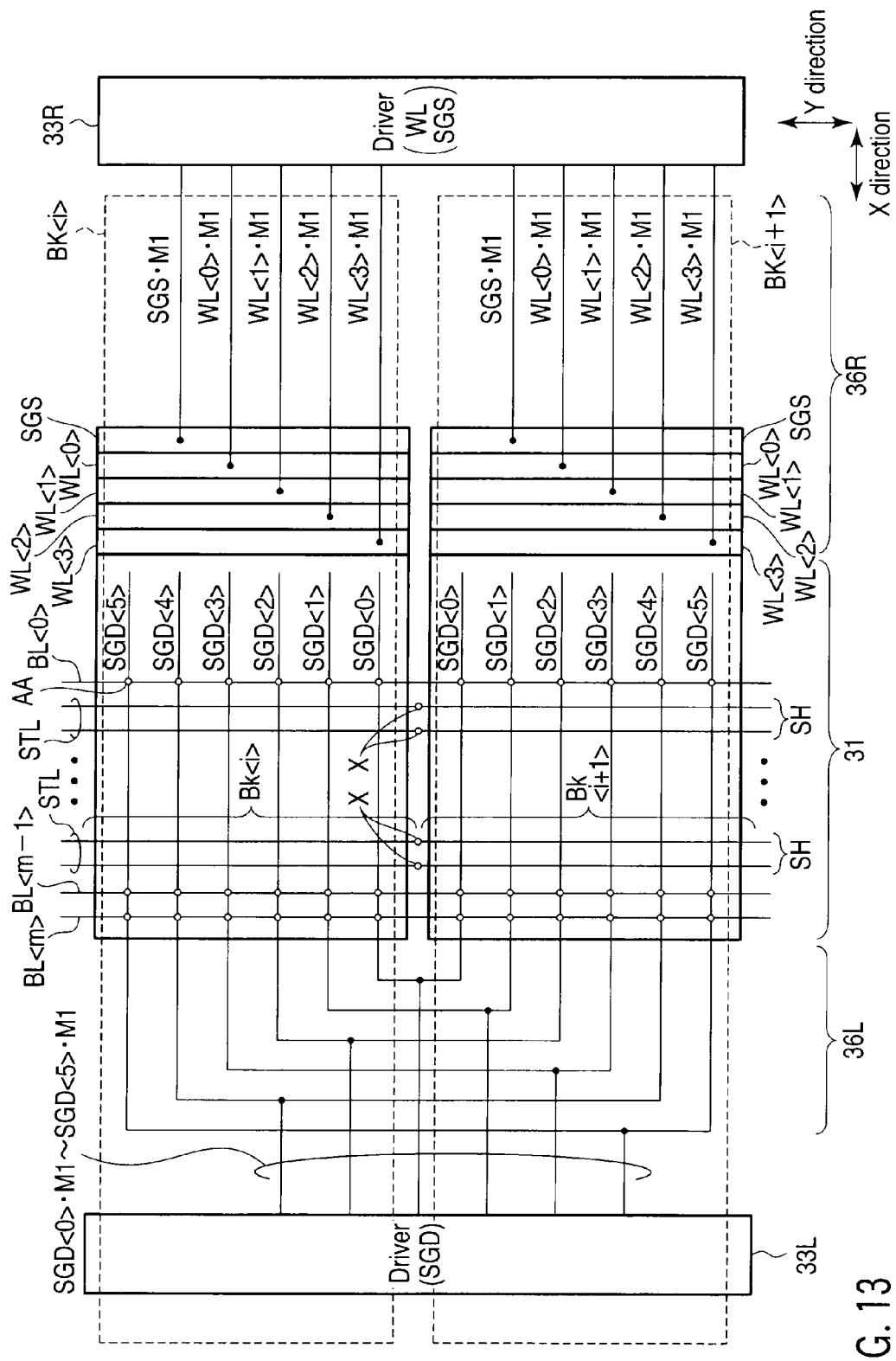
FIG. 13 is a conceptual view of a layout of a first embodiment.
Figure 14:
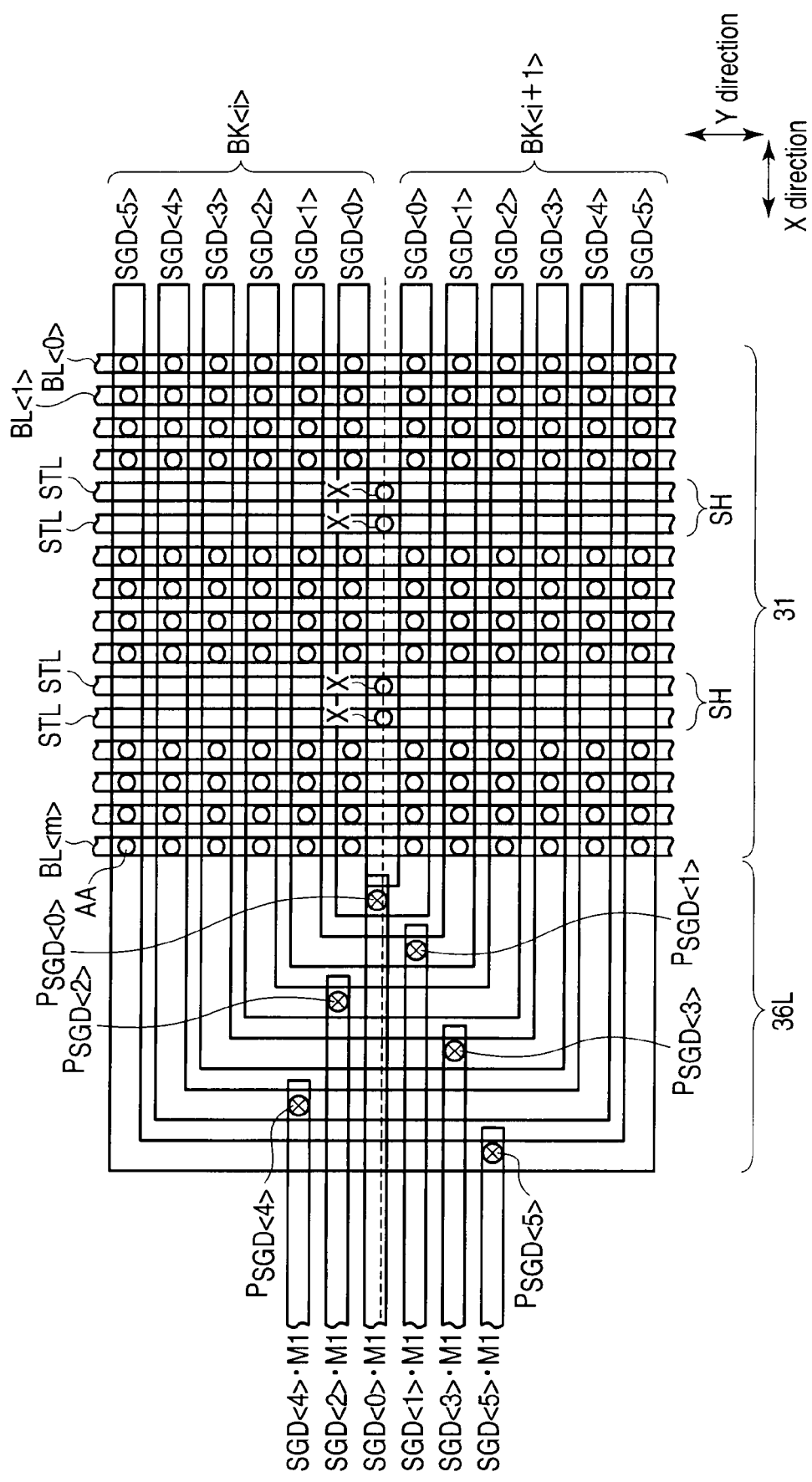
FIG. 14 is a plan view when the first embodiment shown in FIG. 13 is arranged as a device.

FIG. 13 shows a conceptual view of a layout of a first embodiment. FIG. 14 shows a plane layout when the conceptual view of FIG. 13 is specifically arranged as a device.

The first embodiment corresponds to the block layout of FIG. 9. That is, a driver 33L connected to select gate lines SGD<0>, . . . , SGD<5> on a bit line side is disposed on one end (left side) of a memory cell array 31 in the X-direction as well as disposed independently of a driver 33R connected to word lines WL<0>, . . . , WL<3> and to a select gate line SGS on a source line side.

Each of two blocks BK<i>, BK<i+1> is comprised of at least three conductive layers, which are insulated from each other and stacked on a semiconductor substrate, bit lines BL<0>, . . . , BL<m>, which are insulated from the at least three conductive layers and disposed thereon, and active layers (columnar semiconductors) AA whose lower ends are connected to the semiconductor substrate, whose upper ends are connected to the bit lines BL<0>, . . . , BL<m>, and which pass through the at least three conductive layers.

The uppermost layer of the at least three conductive layers is comprised of the select gate lines SGD<0>, . . . , SGD<5> on the bit line side, the lowermost layer of the at least three conductive layers is the select gate line SGS on the source line side, and the remaining conductive layers excluding the uppermost and lowermost layers of the at least three conductive layers are the word lines WL<0>, . . . , WL<3>.

In the first example, although the number of the select gate lines SGD<0>, . . . , SGD<5> on the bit line side is six and the number of the word lines WL<0>, . . . , WL<3> is four in one block, respectively, the numbers are not limited thereto. That is, it is sufficient that the number of the select gate lines on the bit line side and the number of the word lines be at least one in the one block, respectively.

Further, the remaining conductive layers excluding the uppermost layer of the at least three conductive layers have a plate shape whose width in the Y-direction is larger than that in the Y-direction of the select gate lines SGD<0>, . . . , SGD<5> on the bit line side.

Select gate transistors on the bit line side are comprised of the select gate lines SGD<0>, . . . , SGD<5> on the bit line side and the active layers AA, and select gate transistors on the source line side are comprised of the select gate line SGS on the source line side and the active layers AA. Further, memory cells are comprised of the word lines WL<0>, . . . , WL<3> and the active layers AA.

Further, the region between the memory cell array 31 and the driver 33L is arranged as an interconnect portion 36L in which interconnect lines (conductive wires) SGD<0>•M1, . . . , SGD<5>•M1 are disposed to connect the memory cell array 31 to the driver 33L. Likewise, the region between the memory cell array 31 and the driver 33R is arranged as an interconnect portion 36R in which interconnect lines (conductive wires) WL<0>•M1, . . . , WL<3>•M1, and SGS•M1 are disposed to connect the memory cell array 31 to the driver 33R.

The select gate lines SGD<0>, . . . , SGD<5> on the bit line side in the block BK<i> and the select gate lines SGD<0>, . . . , SGD<5> on the bit line side in the block BK<i+1> are connected to the driver 33L after they are commonly connected in the relation of one to one in one end in the X-direction of the memory cell array 31.

Specifically, an i-th (i is a natural number) select gate line on the bit line side from the block BK<i+1> side of the select gate lines SGD<0>, . . . , SGD<5> on the bit line side in the block BK<i> is commonly connected to an i-th select gate line on the bit line side from the block BK<i> side of the select gate lines SGD<0>, . . . , SGD<5> on the bit line side in the block BK<i+1>.

Accordingly, the select gate lines SGD<0>, . . . , SGD<5> on the bit line side have a folded layout in their entirety.

The folded layout can be easily formed by making use of, for example, a side wall masking technology for etching a ground layer using a side wall as a mask.

Shunt areas SH are interposed between the bit lines BL<0>, . . . , BL<m>.

The shunt areas SH are formed along the bit lines BL<0>, . . . , BL<m>. Source lines STL are disposed in the shunt areas SH and extend in the same direction as a direction in which the bit lines BL<0>, . . . , BL<m> extend. The source lines STL are disposed side by side alongside the bit lines BL<0>, . . . , BL<m>.

A source diffusion layer, which is common to the two blocks BK<i>, BK<i+1>, is formed in a semiconductor substrate just under the two blocks BK<i>, BK<i+1>. Further, contact plugs X are interposed between the two blocks BK<i>, BK<i+1>, the contact plugs X having lower ends connected to the source diffusion layer and upper ends connected to the source lines STL disposed above the at least three conductive layers.

The contact plugs X supply a source potential to the source diffusion layer to stabilize the potential thereof.

The contact plugs X are comprised of columnar semiconductors having the same structure as that of, for example, the active layers (columnar semiconductors) AA. Further, the contact plugs X may be comprised of a structure different from that of the active layers (columnar semiconductors) AA, for example, metal or a stack structure thereof.

In the first embodiment, the shunt areas SH are disposed in the memory cell array, which can contribute to stabilize the potential of the source diffusion layer.

In the first embodiment, since the select gate lines SGD<0>, . . . , SGD<5> on the bit line side in two blocks, which are disposed in the Y-direction side by side, are commonly connected in the relation of one to one, the area of the driver 33L for driving them is also reduced. Accordingly, since the area of a periphery circuit is reduced, the first embodiment can contribute to the practical use of a BiCS memory.

In the first embodiment, although the two blocks BK<i>, BK<i+1> are disposed adjacent to each other, other block may be interposed therebetween. Further, although the select gate lines on the bit line side are shared by the two blocks BK<i>, BK<i+1>, the select gate lines on the bit line side may be shared by the at least three blocks or by all the blocks in the memory cell array.

B. Second Embodiment

Figure 16:
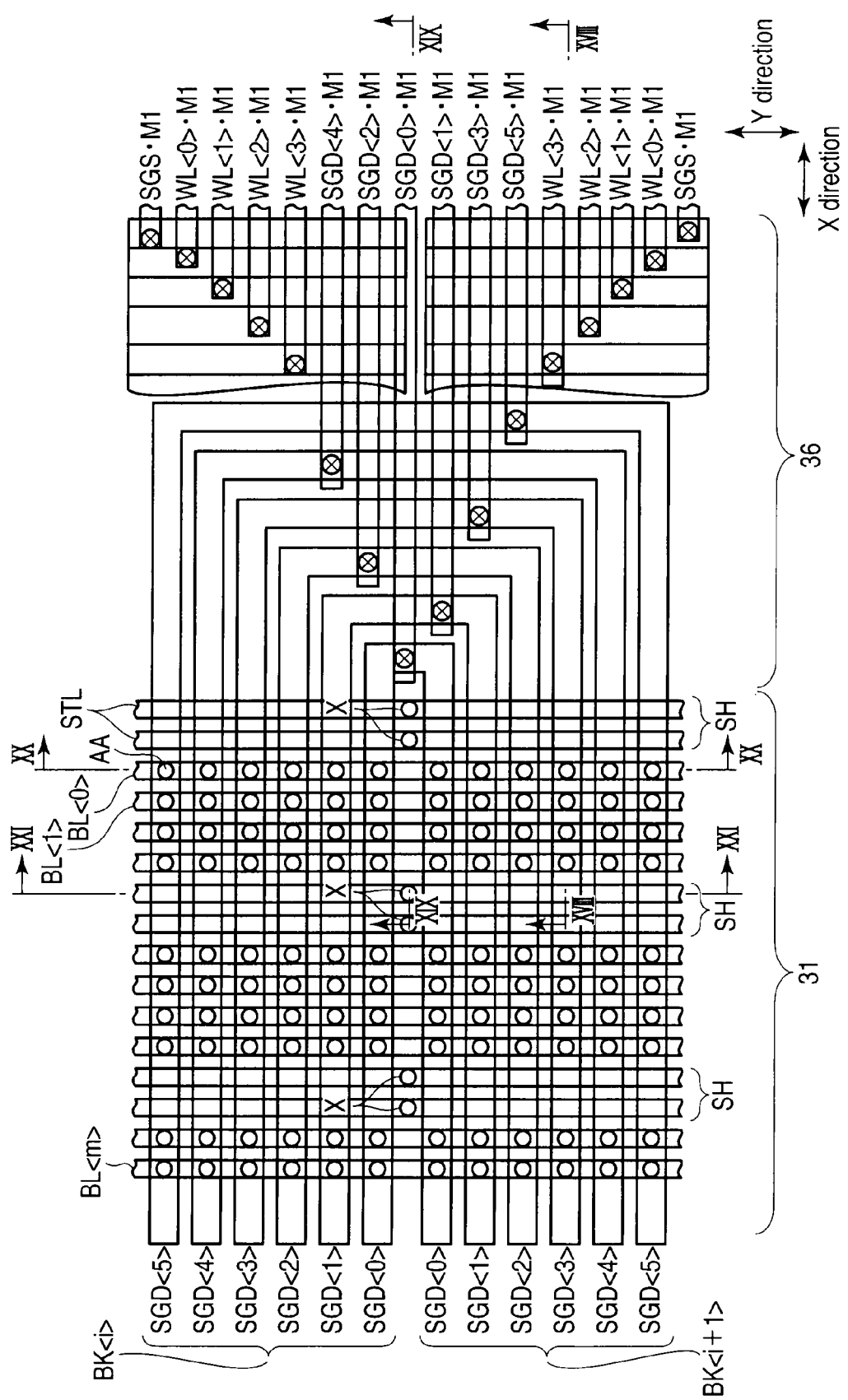
FIG. 16 is a plan view when the second embodiment shown in FIG. 15 is arranged as a device.

FIG. 15 shows a conceptual view of a layout of a second embodiment. FIG. 16 shows a plane layout when the conceptual view of FIG. 15 is specifically arranged as a device.

The second embodiment corresponds to the block layout of FIGS. 10 to 12. That is, a driver 33 (33L and 33R) disposed on one end (right side) of a memory cell array 31 in the X-direction is connected to word lines WL<0>, . . . , WL<3>, a select gate line SGS on a source line side, and select gate lines SGD<0> . . . , SGD<5> on a bit line side.

Attention must be paid to the fact that the portions, to which the layouts of FIGS. 15 and 16 are applied as they are, are limited to the portion between the memory cell array 31L and the driver 33L of FIG. 11 and to the portion between the memory cell array 31L and the driver 33 of FIG. 12.

The layouts, which are obtained by reversing the layouts of FIGS. 15 and 16 in a right to left direction, are applied to the remaining portions between the memory cell array 31 and the driver 33 of FIG. 10, between the memory cell array 31R and the driver 33R of FIG. 11, and between the memory cell array 31R and the driver 33 of FIG. 12.

Each of two blocks BK<i>, BK<i+1> is comprised of at least three conductive layers, which are insulated from each other and stacked on a semiconductor substrate, bit lines BL<0>, . . . , BL<m>, which are insulated from the at least three conductive layers and disposed thereon, and active layers (columnar semiconductors) AA whose lower ends are connected to the semiconductor substrate, whose upper ends are connected to the bit lines BL<0>, . . . , BL<m>, and which pass through the at least three conductive layers.

The uppermost layer of the at least three conductive layers is comprised of the select gate lines SGD<0>, . . . , SGD<5> on the bit line side, the lowermost layer of the at least three conductive layers is a select gate line SGS on the source line side, and the remaining conductive layers excluding the uppermost and lowermost layers of the at least three conductive layers are the word lines WL<0>, . . . , WL<3>.

In the second example, although the number of the select gate lines SGD<0>, . . . , SGD<5> on the bit line side is six and the number of the word lines WL<0>, . . . , WL<3> is four in one block, respectively, the numbers are not limited thereto. That is, it is sufficient that the number of the select gate lines on the bit line side and the number of the word lines be at least one in the one block, respectively.

Further, the remaining conductive layers excluding the uppermost layer of the at least three conductive layers have a plate shape whose width in the Y-direction is larger than the width in the Y-direction of the select gate lines SGD<0>, . . . , SGD<5> on the bit line side.

Select gate transistors on the bit line side are comprised of the select gate lines SGD<0>, . . . , SGD<5> on the bit line side and the active layers AA, and select gate transistors on the source line side are comprised of the select gate line SGS on the source line side and the active layers AA. Further, memory cells are comprised of the word lines WL<0>, . . . , WL<3> and the active layers AA.

Further, the region between the memory cell array 31 (31L and 31R) and the driver 33 (33L and 33R) is arranged as an interconnect portion 36 in which interconnect lines (conductive wires) WL<0>•M1, . . . , WL<3>•M1, SGS•M1, SGD<0>•M1, . . . , SGD<5>•M1 are disposed to connect the memory cell array 31 to the driver 33.

The select gate lines SGD<0>, . . . , SGD<5> on the bit line side in the block BK<i> and the select gate lines SGD<0>, . . . , SGD<5> on the bit line side in the block BK<i+1> are connected to the driver 33 (33L and 33R) after they are commonly connected in the relation of one to one in one end in the X-direction (right side) of the memory cell array 31.

Specifically, an i-th (i is a natural number) select gate line on the bit line side from the block BK<i+1> side of the select gate lines SGD<0>, . . . , SGD<5> on the bit line side in the block BK<i> is commonly connected to an i-th select gate line on the bit line side from the block BK<i> side of the select gate lines SGD<0>, . . . , SGD<5> on the bit line side in the block BK<i+1>.

Accordingly, the select gate lines SGD<0>, . . . , SGD<5> on the bit line side have a folded layout in their entirety.

The folded layout can be easily formed by making use of, for example, a side wall masking technology for etching a ground layer using a side wall as a mask.

Shunt areas SH are interposed between the bit lines BL<0>, . . . , BL<m>.

The shunt areas SH are formed along the bit lines BL<0>, . . . , BL<m>. Source lines STL are disposed in the shunt areas SH and extend in the same direction as a direction in which the bit lines BL<0>, . . . , BL<m> extend. The source lines STL are disposed side by side alongside the bit lines BL<0>, . . . , BL<m>.

A source diffusion layer, which is common to the two blocks BK<i>, BK<i+1>, is formed in a semiconductor substrate just under the two blocks BK<i>, BK<i+1>. Further, contact plugs X are interposed between the two blocks BK<i>, BK<i+1>, the contact plugs X having lower ends connected to the source diffusion layer and upper ends connected to the source lines STL disposed above the at least three conductive layers.

The contact plugs X supply a source potential to the source diffusion layer to stabilize the potential thereof.

The contact plugs X are comprised of columnar semiconductors having the same structure as that of, for example, the active layers (columnar semiconductors) AA. Further, the contact plugs X may be comprised of a structure different from that of the active layers (columnar semiconductors) AA, for example, metal or a stack structure thereof.

The shunt areas SH are disposed in the memory cell array also in the second embodiment, which can contribute to stabilizing the potential of the source diffusion layer.

In the second embodiment, since the select gate lines SGD<0>, . . . , SGD<5> on the bit line side in two blocks, which are disposed in the Y-direction side by side, are commonly connected in the relation of one to one, the area of the driver 33 (33L, 33R) for driving them is also reduced. Accordingly, since the area of a peripheral circuit is reduced, the second embodiment can contribute to the practical use of a BiCS memory.

Further, in the second embodiment, the number of the interconnect lines WL<0>•M1, . . . , WL<3>•M1, SGS•M1, SGD<0>•M1, . . . , SGD<5>•M1 disposed on one end of the memory cell array 31 (31L, 31R) is increased. However, since it is sufficient that these interconnect lines be accommodated within the range of the size of the two blocks BK<i>, BK<i+1> in the Y-direction, a layout of the interconnect lines WL<0>•M1, . . . , WL<3>•M1, SGS•M1, SGD<0>•M1, . . . , SGD<5>•M1 is not made complex.

In the second embodiment, although the two blocks BK<i>, BK<i+1> are disposed adjacent to each other, other block may be interposed therebetween. Further, although the select gate lines on the bit line side are shared by the two blocks BK<i>, BK<i+1>, the select gate lines on the bit line side may be shared by the at least three blocks or by all the blocks in the memory cell array.

C. Other Embodiment

FIG. 17 shows a layout in which drivers are disposed on both the sides of a memory cell array.

As shown in FIG. 17, when the drivers 33 are disposed on both the sides of the memory cell array 31, the size of the drivers 33 in the Y-direction per, for example, one block can be increased (the number of transistors can be increased). As a result, since the size of the drivers 33 in the X-direction can be decreased (the number of transistors can be decreased), the layout of interconnect lines (conductive wires) WL<0>•M1, . . . , WL<3>•M1, SGS•M1, SGD<0>•M1, . . . , SGD<5>•M1 in an interconnect portion 36 is further simplified.

Since shunt areas SH have the same arrangement as those of the first and second embodiments described above, the explanation thereof is omitted.

The shunt areas SH are disposed in the memory cell array also in the other embodiment, which can contribute to stabilizing the potential of a source diffusion layer.

Note that whether the drivers 33 (33L and 33R) are disposed on one sides of the memory cell arrays 31 (31L and 31R) as shown in FIGS. 10 to 12 or the drivers 33 are disposed on both the sides of the memory cell array 31 as shown in FIG. 17 is determined in consideration of the specification of the BiCS memory (chip), the area efficiency of the peripheral circuit, and the like.

(3) Structure of Contact Plug in Shunt Area

A structure of a contact plug in a shunt area will be explained.

Figure 18:
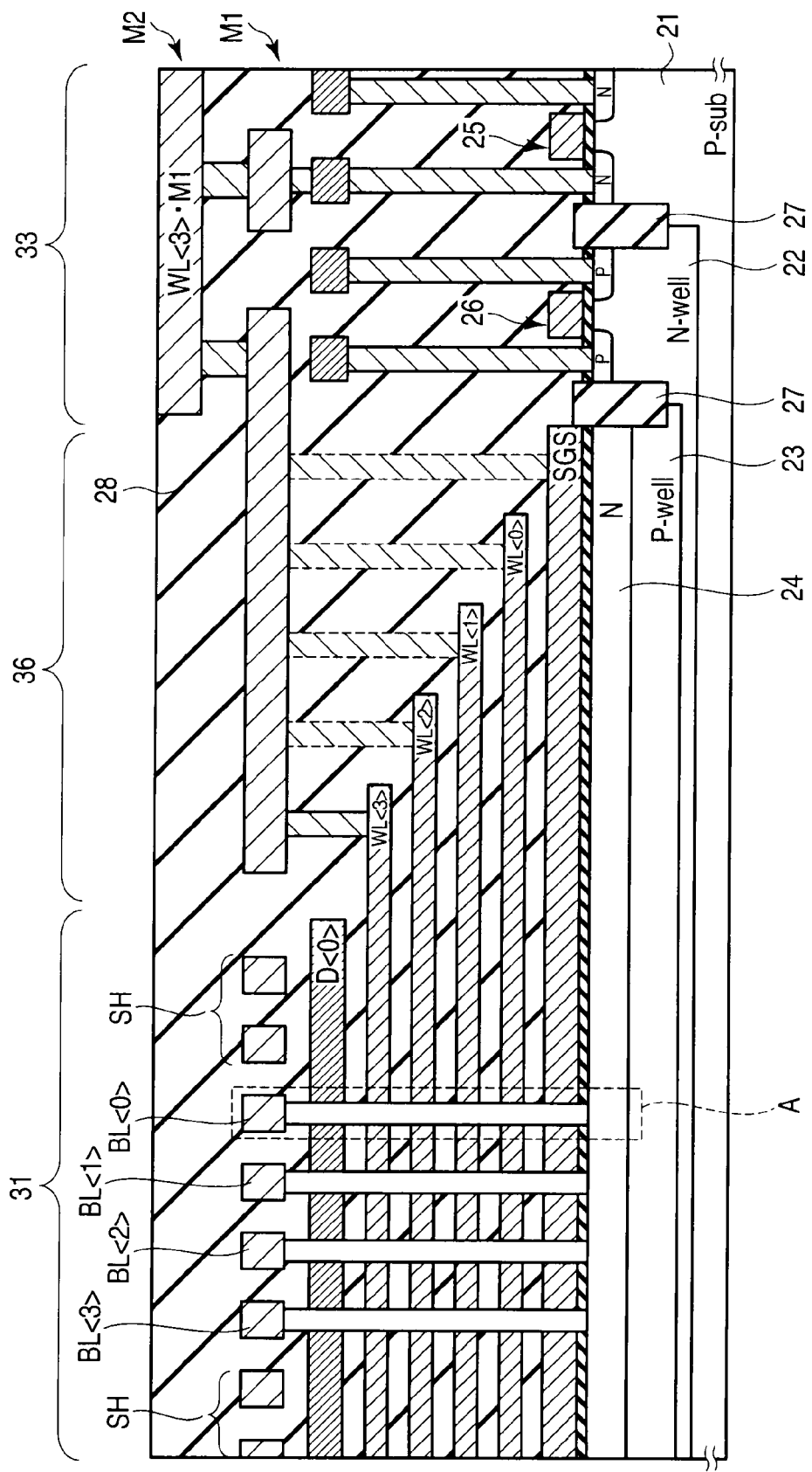
FIG. 18 is a sectional view taken along line XVIII-XVIII of FIG. 16.
Figure 20:
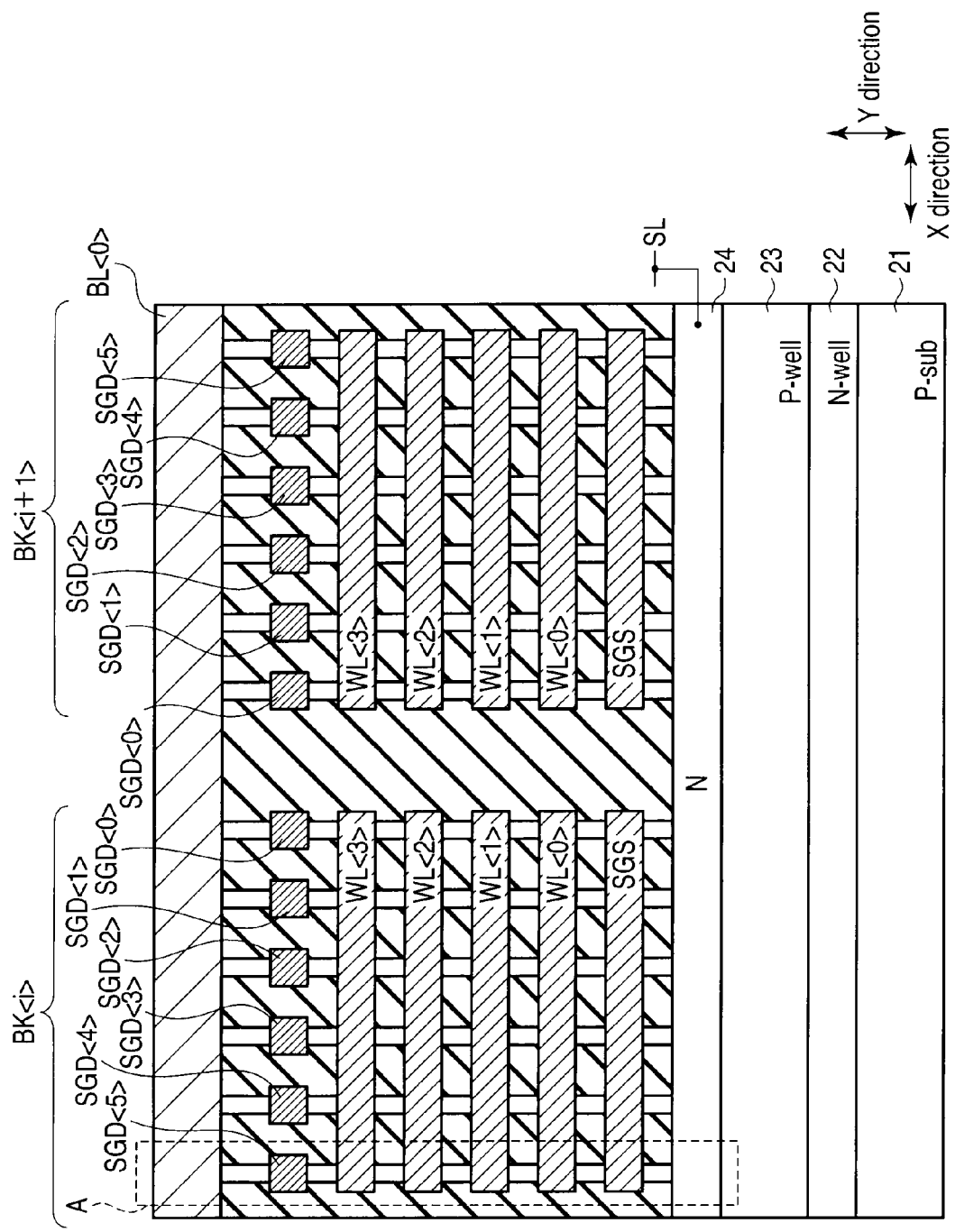
FIG. 20 is a sectional view taken along line XX-XX of FIG. 16.
Figure 21:
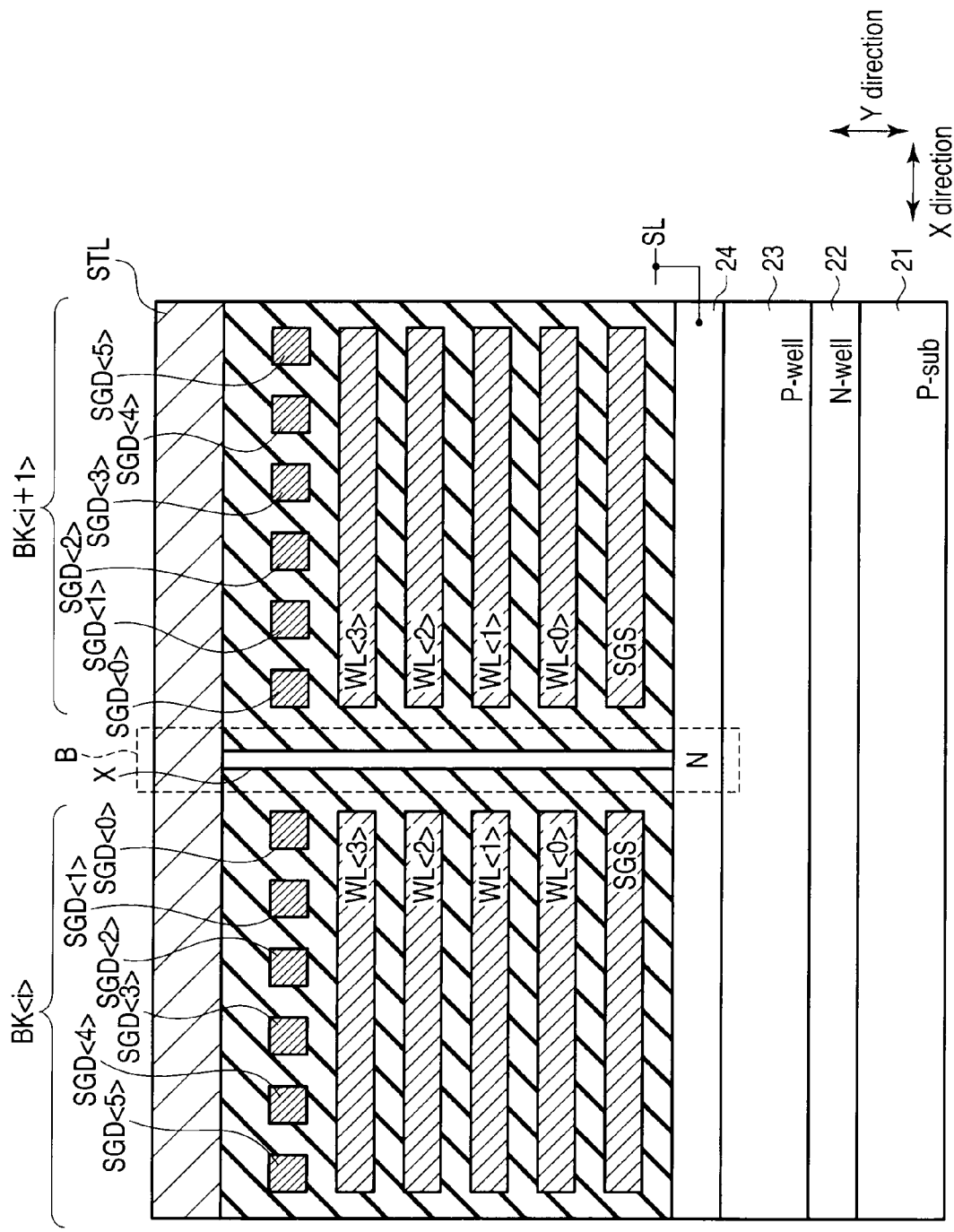
FIG. 21 is a sectional view taken along line XXI-XXI of FIG. 16.

FIG. 18 is a sectional view taken along line XVIII-XVIII of FIG. 16, FIG. 19 is a sectional view taken along line XIX-XIX of FIG. 16, FIG. 20 is a sectional view taken along line XX-XX of FIG. 16, and FIG. 21 is a sectional view taken along line XXI-XXI of FIG. 16.

First, no active layer (columnar semiconductor) AA is formed in shunt areas SH in blocks BK<i>, BK<i+1>. That is, no cell unit (memory cell) is formed in the shunt areas SH. Active layers AA are formed in an area excluding the shunt areas SH in the blocks BK<i>, BK<i+1>. Cell units A are formed on side surfaces of the active layer AA. The cell units A have a structure as shown in, for example, FIG. 5.

The contact plugs X are formed in the shunt areas SH between the blocks BK<i>, BK<i+1>. Since the contact plugs X are interposed between the blocks BK<i>, BK<i+1>, they do not pass through at least three conductive layers in a memory cell array 31.

Figure 22:
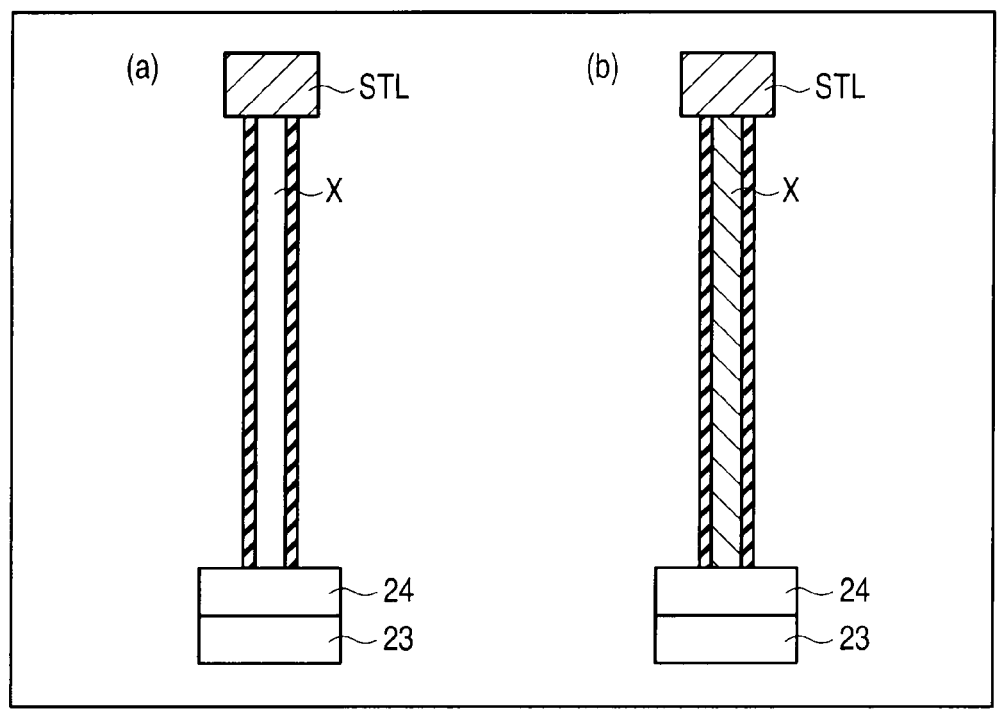
FIG. 22 is sectional view showing a structure of a contact plug in a shunt area.

FIGS. 22A and 22B show an example of a structure of a contact plug in an area B of FIGS. 19 and 21.

The contact plug X may be comprised of a columnar semiconductor having the same structure as that of the active layers (columnar semiconductors) in the memory cell array as shown in FIG. 22A or may be comprised of a structure different from that of the active layers, for example, metal or a stack structure thereof as shown in FIG. 22B.

(4) Overall Structure of Shunt Area

FIG. 23 shows an overall structure of a shunt area.

The example corresponds to the block layout of FIG. 12.

Cell source decoders 37 are disposed on one ends of the memory cell arrays 31L, 31R in the Y-direction, and sense amplifiers 32L, 32R are disposed on the other ends of the memory cell arrays 31L, 31R in the Y-direction. Each shunt area SH extends in the Y-direction in which bit lines BL<0>, . . . , BL<m> extend, and a source line STL is disposed in each shunt area SH and extends in the Y-direction.

The shunt areas SH are periodically disposed in the X-direction in the memory cell arrays 31L, 31R. Further, the contact plugs X having lower ends connected to a source diffusion layer 24 and upper ends connected to the source lines STL are periodically interposed between blocks BK<0>, BK<1>, . . . , BK<n>. However, the shunt areas SH and the contact plugs X are not necessarily formed periodically.

Further, although the contact plugs X are disposed in the overall areas between the blocks BK<0>, BK<1>, . . . , BK<n> in the example, they may not be disposed in, for example, a part of the areas between the blocks BK<0>, BK<1>, . . . , BK<n>.

(5) Modification

A modification of the layout of the shunt area will be explained.

A. First Modification

FIG. 24 shows a layout of a shunt area according to a first modification. FIG. 25 is a sectional view taken along line XXV-XXV of FIG. 24, and FIG. 26 is a sectional view taken along line XXVI-XXVI of FIG. 24.

The first modification has a feature in that a common source line STL•common is disposed above bit lines BL<0>, . . . , BL<m> and source lines STL and connected to the source lines STL.

Although the first modification is arranged based on the second embodiment (FIGS. 15 and 16), it can be also applied to the first embodiment (FIGS. 13 and 14) as a matter of course.

The common source line STL•common, which is connected to the source lines STL, is disposed above the bit lines BL<0>, . . . , BL<m> and the source lines STL. A layout of the common source line STL•common is not particularly limited. For example, the common source line STL•common may be formed flat on a memory cell array 31 or may be a conductive wire having a width larger than those of the source lines STL. Further, the common source line STL•common may have a grid layout.

The bit lines BL<0>, . . . , BL<m> and the source lines STL are formed in, for example, a first metal layer M1, and the common source line STL•common is formed in, for example, a second metal layer M2 on the first metal layer M1.

Since the other arrangement of the first modification is the same as that of the second embodiment, the explanation thereof is omitted here.

B. Second Modification

Figure 27:
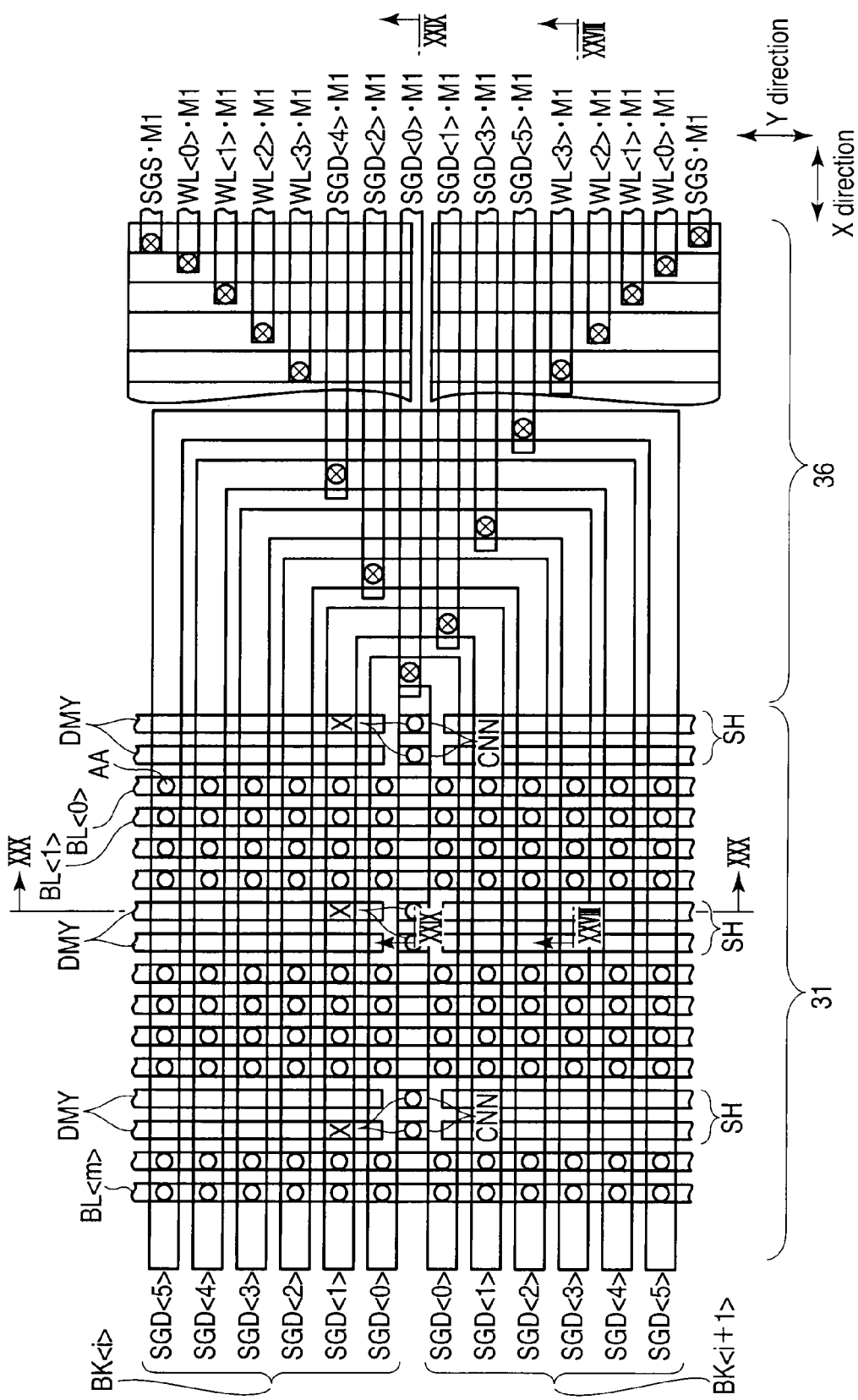
FIG. 27 is a plan view showing a layout of a second modification.
Figure 28:
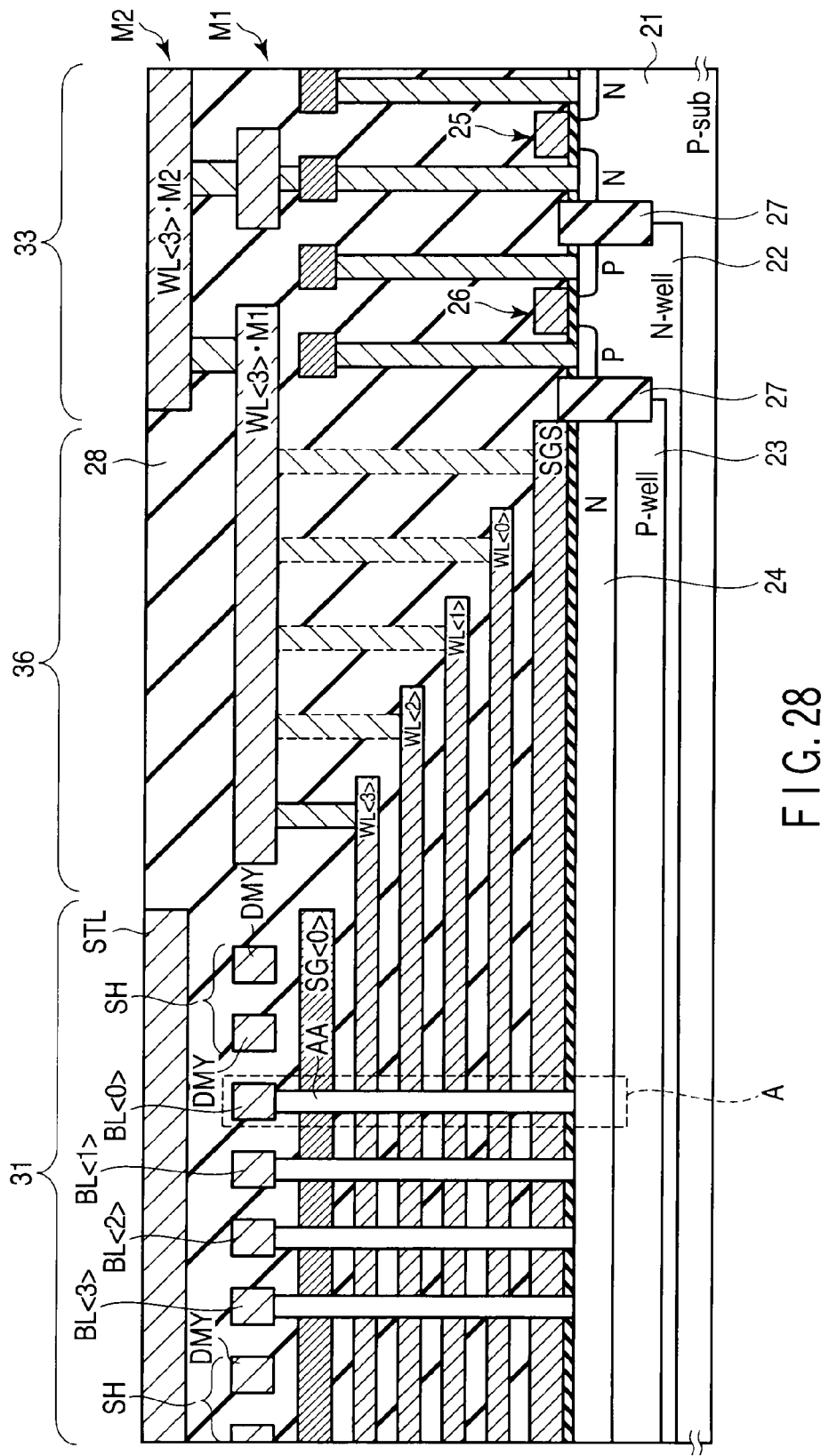
FIG. 28 is a sectional view taken along line XXVIII-XXVIII of FIG. 27.
Figure 29:
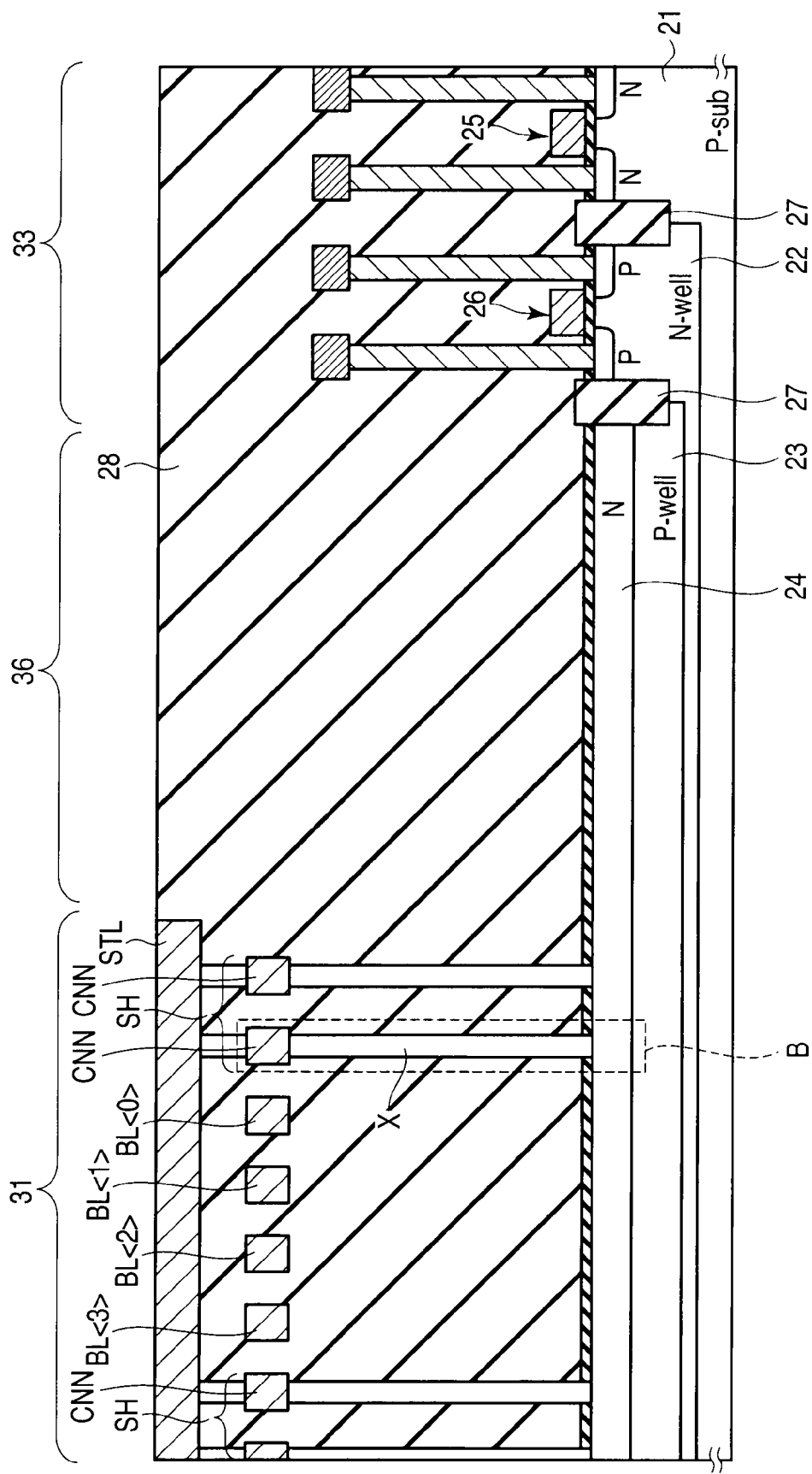
FIG. 29 is a sectional view taken along line XXIX-XXIX of FIG. 27.
Figure 30:
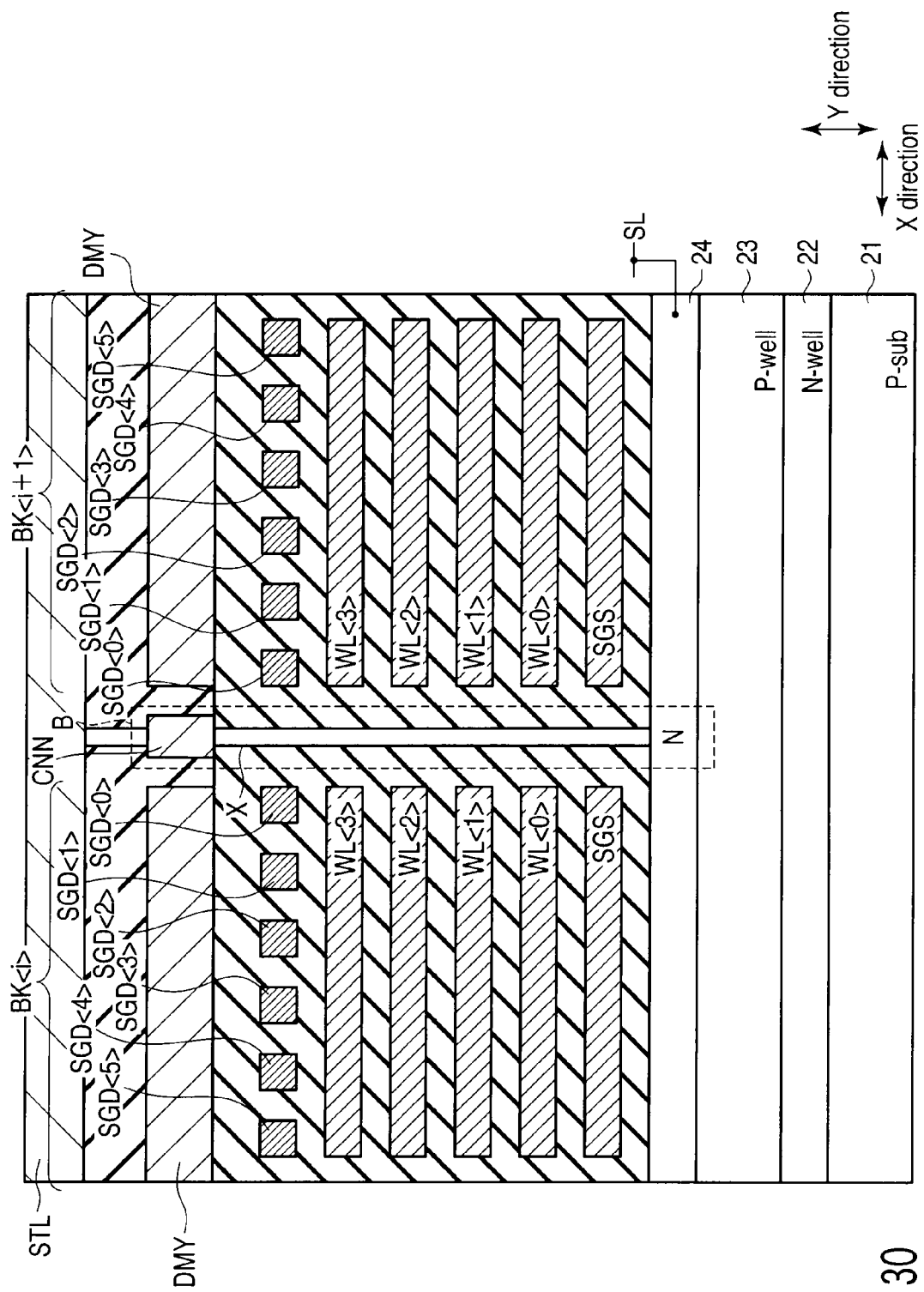
FIG. 30 is a sectional view taken along line XXX-XXX of FIG. 27.

FIG. 27 shows a layout of a shunt area according to a second modification. FIG. 28 is a sectional view taken along line XXVIII-XXVIII of FIG. 27, FIG. 29 is a sectional view taken along line XXIX-XXIX of FIG. 27, and FIG. 30 is a sectional view taken along line XXX-XXX of FIG. 27.

The second modification has a feature in that dummy bit lines DMY are disposed in shunt areas SH between bit lines BL<0>, . . . , BL<m> and placed in an electrically floating state.

Although the second modification is arranged based on the second embodiment (FIGS. 15 and 16), it can be also applied to the first embodiment (FIGS. 13 and 14) as a matter of course.

The dummy bit lines DMY in the electrically floating state are disposed in the shunt areas SH between the bit lines BL<0>, . . . , BL<m>. Further, connection members (conductive members) CNN are disposed in the shunt areas SH on contact plugs X.

Source lines STL are disposed above the bit lines BL<0>, . . . , BL<m>, the dummy bit lines DMY, and the connection members CNN as well as connected to the upper ends of the contact plugs X through the connection members CNN.

A layout of the source lines STL is not particularly limited. For example, the source lines STL may be formed flat on a memory cell array 31 or may be conductive wires having a width larger than those of the bit lines BL<0>, . . . , BL<m>. Further, the source lines STL may have a grid layout.

The bit lines BL<0>, . . . , BL<m>, the dummy bit lines DMY, and the connection members CNN are formed in, for example, a first metal layer M1, and the source lines STL are formed in, for example, a second metal layer M2 on the first metal layer M1.

Since the other arrangement of the second modification is the same as that of the second embodiment, the explanation thereof is omitted here.

C. Third Modification

FIGS. 31 and 32 show a layout of a shunt area according to a third modification, FIG. 31 shows a structure in a block, and FIG. 32 shows a structure between blocks.

The third modification is arranged based on the first modification or the second modification.

The third modification arranged based on the first modification will be shown below.

The third modification has a feature in that two memory cell arrays L1, L2 are stacked on a semiconductor substrate 21, and a common source line STL•common is shared by the two memory cell arrays L1, L2 in this case.

A structure of the memory cell array L2 on an upper side is the same as that of the memory cell array L1 on a lower side.

The structure of the memory cell array L2 on the upper side is omitted here to simplify illustration. Further, an active layer (columnar semiconductor) and a contact plug X of the memory cell array L2 on the upper side are connected to a common source line STL•common in the memory cell array L1 on the lower side.

Since the common source line STL•common is shared as described above, the two memory cell arrays L1, L2 or more memory cell arrays can be stacked on the semiconductor substrate 21.

A technology for stacking the memory cell arrays L1, L2 is very effective when active layers (columnar semiconductors) AA cannot have a sufficient height due to the problem of the processing accuracy thereof in, for example, a BiCS-NAND flash memory, i.e., when the number of memory cells cannot be increased in a NAND cell unit.

(6) Conclusion

As described above, according to the embodiments of the present invention, the potential of a source diffusion layer of a three dimensional stacked nonvolatile semiconductor memory to which a BiCS technology is applied can be stabilized.

4. Application Example

Although the technology of the present invention is effective for a BiCS-NAND flash memory in which one cell unit is comprised of memory cells (NAND columns) connected to each other in series to realize bit cost scalability, the technology can be also applied to a three dimensional stacked nonvolatile semiconductor memory to which the BiCS technology is applied in addition to the above BiCS-NAND flash memory.

For example, the technology of the present invention is also effective for a nonvolatile semiconductor memory which has exactly the same device structure as that of the BiCS-NAND flash memory but in which only one central memory cell of memory cells in one cell unit is used as a memory cell and the remaining memory cells are used as dummy cells as an example other than the BiCS-NAND flash memory.

Further, as to a memory cell structure of the BiCS memory, it is considered that a so-called MONOS type, in which a charge accumulation layer is comprised of an insulation material (for example, nitride), is effective, but the example of the present invention is not limited thereto and can be also applied to a floating gate type in which a charge accumulation layer is comprised of conductive polysilicon.

Further, a data value stored in one memory cell may be a binary value (two-level) or a multivalue (multi-level) of at least a ternary value (three-level).

5. Advantages

According to the present invention, the potential of a source diffusion layer of a three dimensional stacked nonvolatile semiconductor memory to which a BiCS technology is applied can be stabilized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A nonvolatile semiconductor memory comprising:
   a semiconductor substrate;
   a memory cell array including a first block and a second block disposed above the semiconductor substrate adjacent to each other in a first direction; and a first driver disposed on one end of the memory cell array in a second direction orthogonal to the first direction, wherein the first and second blocks include at least two conductive layers arranged in a third direction perpendicular to the first and second directions above the semiconductor substrate, bit lines disposed above the at least two conductive layers extending in the first direction, and columnar semiconductors passing through the at least two conductive layers, and wherein a source diffusion layer is disposed in the semiconductor substrate under the first and second blocks and extends in an in-plane direction which is formed by the first direction and the second direction, a conductive element, which has a lower end connected to the source diffusion layer and an upper end connected to a source line disposed above the at least two conductive layers, the conductive element extends in the third direction and is interposed between ends of the at least two conductive layers of the first block and ends of the at least two conductive layers of the second block, and the columnar semiconductors in the first and second blocks have lower ends connected to the source diffusion layer and upper ends connected to the bit lines.

2. The memory according to claim 1, wherein the conductive element is comprised of a columnar semiconductor having the same structure as those of the columnar semiconductors.

3. The memory according to claim 1, further comprising a dummy bit line and a connection member disposed alongside the bit lines, wherein the source line is disposed above the bit lines as well as connected to the upper end of the conductive element through the connection member, and the dummy bit line is placed in a floating state.

4. The memory according to claim 1, wherein the source line is disposed alongside the bit lines, and the bit lines and the source lines extend in the first direction together.

5. The memory according to claim 1, wherein the source line is connected to a common source lines disposed above the bit lines and the source line.

6. The memory according to claim 1, wherein one end in the second direction of the at least two conductive layers is formed stepwise.

7. The memory according to claim 6, wherein one end in the second direction of each of the at least two conductive layers is connected to an interconnect line located above the at least two conductive layers through the conductive element.

8. The memory according to claim 7, wherein the interconnect line is connected to the first driver.

9. The memory according to claim 6, wherein one end in the second direction of each of the at least two conductive layers excluding the uppermost layer is connected to an interconnect line located above the at least two conductive layers through a contact plug.

10. The memory according to claim 9, wherein the interconnect line is connected to the first driver.

11. The memory according to claim 9, wherein the other end in the second direction of the uppermost layer of the at least two conductive layers is connected to an interconnect line located above the at least two conductive layers through a contact plug.

12. The memory according to claim 1, wherein the memory cell and the select gate transistor comprise a NAND cell unit.

13. The memory according to claim 1, wherein the semiconductor substrate has the source diffusion layer, and the columnar semiconductors are connected to the source diffusion layer.

14. The memory according to claim 13, wherein the source diffusion layer is common to the first and second blocks.

15. The memory according to claim 1, wherein at least two of the columnar semiconductors in the first and second blocks are connected to one of the bit lines and pass through the at least two conductive layers.

16. A nonvolatile semiconductor memory comprising:
a semiconductor substrate;
a memory cell array including a first block and a second block disposed above the semiconductor substrate adjacent to each other in a first direction; and
a first driver disposed on one end of the memory cell array in a second direction orthogonal to the first direction, wherein the first and second blocks include at least three conductive layers arranged in a third direction perpendicular to the first and second directions above the semiconductor substrate, bit lines disposed above the at least three conductive layers extending in the first direction, and columnar semiconductors passing through the at least three conductive layers, wherein an uppermost layer of the at least three conductive layers is comprised of first select gate lines extending in the second direction, a lowermost layer of the at least three conductive layers is a second select gate line, remaining conductive layers excluding the uppermost layer and the lowermost layer of the at least three conductive layers are a word line, and remaining conductive layers excluding the uppermost layer of the at least three conductive layers have a plate shape whose width in the first direction is larger than the width in the first direction of the first select gate lines, wherein select gate transistors are comprised of the first select gate lines and the columnar semiconductors, and the second select gate line and the columnar semiconductors, respectively and memory cells are comprised of the word line and the columnar semiconductors, respectively, and wherein a source diffusion layer is disposed in the semiconductor substrate under the first and second blocks and extends in an in-plane direction which is formed by the first direction and the second direction, a conductive element, which has a lower end connected to the source diffusion layer and an upper end connected to a source line disposed above the at least three conductive layers, the conductive element extends in the third direction and is interposed between ends of at least two conductive layers of the first block and ends of at least two conductive layers of the second block, and the columnar semiconductors in the first and second blocks have lower ends connected to the source diffusion layer and upper ends connected to the bit lines.

17. The memory according to claim 16, wherein the conductive element is comprised of a columnar semiconductor which has the same structure as the columnar semiconductors passing through the at least three conductive layers.

18. The memory according to claim 16, wherein the source line is connected to a common source line which is provided above the bit lines and the source line.

19. The memory according to claim 16, wherein the memory cell and the select gate transistor comprise a NAND cell unit.

20. The memory according to claim 16, wherein the semiconductor substrate has the source diffusion layer, and the columnar semiconductors are connected to the source diffusion layer.

21. The memory according to claim 16, wherein at least two of the columnar semiconductors in the first and second blocks are connected to one of the bit lines and pass through the at least two conductive layers.

22. A nonvolatile semiconductor memory comprising:
a semiconductor substrate; and
a memory cell array including a first block and a second block disposed above the semiconductor substrate adjacent to each other in a first direction,
wherein the first and second blocks include at least two conductive layers arranged in a third direction perpendicular to the first and second directions above the semiconductor substrate, bit lines disposed above the at least two conductive layers extending in the first direction, and columnar semiconductors passing through the at least two conductive layers,
wherein the memory cell and the select gate transistor comprise a NAND cell unit and the NAND cell unit is connected between the bit line and the source line which are provided above the at least two conductive layers and are insulated from the at least two conductive layers, and the columnar semiconductors in the first and second blocks having lower ends connected to a source diffusion layer of the NAND cell unit and upper ends connected to the bit lines, the source diffusion layer extending in an in-plane direction which is formed by the first direction and a second direction perpendicular to the first direction,
a conductive element, which has a lower end connected to the source diffusion layer and an upper end connected to a source line disposed above the at least two conductive layers, the conductive element extends in the third direction and is interposed between ends of the at least two conductive layers of the first block and ends of the at least two conductive layers of the second block, and
the columnar semiconductors in the first and second blocks have lower ends connected to the source diffusion layer and upper ends connected to the bit lines.

23. The memory according to claim 22, wherein at least two of the columnar semiconductors in the first and second blocks are connected to one of the bit lines and pass through the at least two conductive layers.

* * * * *